(12) United States Patent
Odnoblyudov et al.

(10) Patent No.: US 11,699,750 B2
(45) Date of Patent: *Jul. 11, 2023

(54) GALLIUM NITRIDE EPITAXIAL STRUCTURES FOR POWER DEVICES

(71) Applicant: QROMIS, Inc., Santa Clara, CA (US)

(72) Inventors: Vladimir Odnoblyudov, Danville, CA (US); Steve Lester, Palo Alto, CA (US); Ozgur Aktas, Pleasanton, CA (US)

(73) Assignee: QROMIS, INC., Santa Clara, CA (US)

( * ) Notice: Subject to any disclaimer, the term of this patent is extended or adjusted under 35 U.S.C. 154(b) by 225 days.

This patent is subject to a terminal disclaimer.

(21) Appl. No.: 17/061,241

(22) Filed: Oct. 1, 2020

(65) Prior Publication Data

US 2021/0057563 A1    Feb. 25, 2021

Related U.S. Application Data

(63) Continuation of application No. 16/430,235, filed on Jun. 3, 2019, now Pat. No. 10,833,186, which is a
(Continued)

(51) Int. Cl.
*H01L 29/778* (2006.01)
*H01L 29/20* (2006.01)
(Continued)

(52) U.S. Cl.
CPC .... *H01L 29/7787* (2013.01); *H01L 21/02002* (2013.01); *H01L 21/0217* (2013.01);
(Continued)

(58) Field of Classification Search
CPC .. H01L 23/562; H01L 29/205; H01L 21/0242
See application file for complete search history.

(56) References Cited

U.S. PATENT DOCUMENTS

| 10,335,120 B2 * | 7/2019 | Snyder ............... A61B 8/145 |
| 10,355,120 B2 | 7/2019 | Odnoblyudov et al. |

(Continued)

FOREIGN PATENT DOCUMENTS

| CN | 102244091 A | 11/2011 |
| CN | 102544086 A | 7/2012 |

(Continued)

OTHER PUBLICATIONS

Wuerfl, J. et al., "Technical Approach to High Voltage and Fast Switching GAN Power Transistors", Journal of Functional Materials and Devices, vol. 19(6), pp. 289-294, (Dec. 2013).
(Continued)

*Primary Examiner* — Fernando L Toledo
*Assistant Examiner* — Valerie N Newton
(74) *Attorney, Agent, or Firm* — Kilpatrick Townsend & Stockton LLP

(57) ABSTRACT

A method for making a multilayered device on an engineered substrate having a substrate coefficient of thermal expansion includes growing a buffer layer on the engineered substrate, and growing a first epitaxial layer on the buffer layer. The first epitaxial layer is characterized by an epitaxial coefficient of thermal expansion substantially equal to the substrate coefficient of thermal expansion.

22 Claims, 18 Drawing Sheets

Related U.S. Application Data continuation of application No. 15/864,977, filed on Jan. 8, 2018, now Pat. No. 10,355,120.

(60) Provisional application No. 62/591,016, filed on Nov. 27, 2017, provisional application No. 62/447,857, filed on Jan. 18, 2017.

(51) Int. Cl.
   *H01L 21/02*      (2006.01)
   *H01L 29/66*      (2006.01)
   *H01L 29/205*     (2006.01)
   *H01L 29/267*     (2006.01)

(52) U.S. Cl.
   CPC ...... *H01L 21/0242* (2013.01); *H01L 21/0245* (2013.01); *H01L 21/0254* (2013.01); *H01L 21/0262* (2013.01); *H01L 21/02458* (2013.01); *H01L 21/02488* (2013.01); *H01L 21/02499* (2013.01); *H01L 21/02505* (2013.01); *H01L 21/02634* (2013.01); *H01L 29/205* (2013.01); *H01L 29/66462* (2013.01); *H01L 29/7786* (2013.01); *H01L 29/2003* (2013.01); *H01L 29/267* (2013.01)

(56) References Cited

U.S. PATENT DOCUMENTS

| | | | |
|---|---|---|---|
| 10,833,186 | B2 * | 11/2020 | Odnoblyudov ....... H01L 29/157 |
| 2009/0261363 | A1 | 10/2009 | Chen et al. |
| 2011/0117726 | A1 | 5/2011 | Pinnington et al. |
| 2011/0147772 | A1 | 6/2011 | Lochtefeld et al. |
| 2013/0157445 | A1 | 6/2013 | Miyashita et al. |
| 2014/0183442 | A1 | 7/2014 | Odnoblyudov et al. |
| 2014/0183443 | A1 | 7/2014 | Coursey et al. |
| 2015/0125974 | A9 | 5/2015 | Lester et al. |
| 2016/0079370 | A1 | 3/2016 | Sugiyama et al. |
| 2017/0170232 | A1 | 6/2017 | Odnoblyudov et al. |
| 2018/0061630 | A1 | 3/2018 | Odnoblyudov et al. |
| 2018/0061694 | A1 | 3/2018 | Odnoblyudov et al. |
| 2019/0371929 | A1 | 12/2019 | Odnoblyudov et al. |

FOREIGN PATENT DOCUMENTS

| | | |
|---|---|---|
| CN | 102656712 A | 9/2012 |
| CN | 105047695 A | 11/2015 |
| JP | 2010-192745 A | 9/2010 |
| JP | 2016-035949 A | 3/2016 |
| JP | 2016-058693 A | 4/2016 |
| JP | 2015-135946 A | 7/2016 |
| KR | 10-2014-0049057 A | 4/2014 |
| WO | 2011/084596 A1 | 7/2011 |

OTHER PUBLICATIONS

First Office Action dated Dec. 16, 2020 in related Chinese Patent Application No. 201880007184.0, filed Jan. 10, 2018 (twelve pages).
First Office Action dated Feb. 3, 2022 in related Japanese Application 2019-538435, filed Jan. 10, 2018 (four pages).
First Office Action dated Feb. 22, 2022 of related Korean Application No. 10-2019-7024120 filed Jan. 10, 2018 (two pages).
International Search Report and Written Opinion dated Apr. 4, 2018 in related International Application No. PCT/US2018/013206, filed Jan. 10, 2018 (eight pages).
International Preliminary Report on Patentability, dated Aug. 1, 2019 in related International Application No. PCT/US2018/013206, filed Jan. 10, 2018 (seven pages).
Non-Final Office Action in related U.S. Appl. No. 15/864,977 dated Jun. 28, 2018 (eleven pages).
Non-Final Office Action in related U.S. Appl. No. 16/430,235 dated Oct. 21, 2019 (eleven pages).
Final Office Action in related U.S. Appl. No. 16/430,235 dated Apr. 16, 2020 (thirteen pages).
Supplementary European Search Report dated Sep. 3, 2020 in corresponding European Patent Application No. 18741122.8, filed Jan. 10, 2018 (ten pages).
Li, Tingkai et al., "III-V Compound Semiconductors: Integration With Silicon-Based Microelectronics; Chapter 2: Challenge of III-V Materials Integration with Si Microelectronics," pp. 51-96, (Jan. 2011).
Medjdoub, Farid et al., "Effects of AlGaN Back Barrier on AlN/GaN-on-Silicon High-Electron-Mobility Transistors", Applied Physics Express, The Japan Society of Applied Physics; Japan, vol. 4, No. 12, pp. 124101-1 to 124101-3, (Dec. 2011).
Wang, Wenjing et al., "Influence of AlGaN Back Barrier Layer Thickness on the Dynamic RON Characteristics of AlGaN/GaN HEMTs," 2016 13th China International Forum on Solid State Lighting: International Forum on Wide Bandgap Semiconductors China (SSLCHINA:IFWS), pp. 77-80, (Nov. 2016).
Decision by Patent Examination Office dated Jul. 4, 2022 in related Taiwanese Patent Application No. 107101365 (four pages).
Communication pursuant to Article 94(3) EPC dated Jul. 12, 2022 in related European Patent Application No. 18741122 8 (eight pages).
Decision to Grant dated Oct. 20, 2022 in related Korean Application No. 10-2019-7024120 (six pages).

* cited by examiner

GALLIUM NITRIDE EPITAXIAL STRUCTURES FOR POWER DEVICES

CROSS-REFERENCES TO RELATED APPLICATIONS

This application is a continuation application of U.S. patent application Ser. No. 16/430,235, filed on Jun. 3, 2019, which is continuation application of U.S. patent application Ser. No. 15/864,977, filed on Jan. 8, 2018, now U.S. Pat. No. 10,355,120, which claims the benefit of U.S. Provisional Patent Application No. 62/447,857, filed on Jan. 18, 2017, and U.S. Provisional Patent Application No. 62/591,016, filed on Nov. 27, 2017, the contents of which are hereby incorporated by reference in their entireties.

BACKGROUND OF THE INVENTION

Gallium nitride based power devices are typically epitaxially grown on sapphire substrates. The growth of gallium nitride based power devices on a sapphire substrate is a heteroepitaxial growth process since the substrate and the epitaxial layers are composed of different materials. Due to the heteroepitaxial growth process, the epitaxially grown material can exhibit a variety of adverse effects, including reduced uniformity and reductions in metrics associated with the electronic/optical properties of the epitaxial layers. Accordingly, there is a need in the art for improved methods and systems related to epitaxial growth processes and substrate structures.

SUMMARY OF THE INVENTION

According to some embodiments of the present invention, a method for making a multilayered device on an engineered substrate having a substrate coefficient of thermal expansion includes growing a buffer layer on the engineered substrate, and growing a first epitaxial layer on the buffer layer. The first epitaxial layer is characterized by an epitaxial coefficient of thermal expansion substantially equal to the substrate coefficient of thermal expansion.

According to some other embodiments of the present invention, a method for making a multilayered device on an engineered substrate having a substrate coefficient of thermal expansion includes growing a buffer layer on the engineered substrate, and growing one or more epitaxial layers on the buffer layer. At least one of the one or more epitaxial layers is characterized by an epitaxial coefficient of thermal expansion substantially equal to the substrate coefficient of thermal expansion. In some embodiments, the one or more epitaxial layers may include a superlattice of alternating undoped GaN layer and doped GaN layer. The doped GaN layer may include carbon-doped GaN (C—GaN) or iron-doped GaN (Fe—GaN). The method may further include growing an undoped GaN layer coupled to the superlattice, and growing a first epitaxial layer coupled to the undoped GaN layer. The first epitaxial layer may include aluminum gallium nitride (AlGaN) or indium aluminum nitride (InAlN). An interface between the undoped GaN layer and the first epitaxial layer may form a conducting channel of a high-electron-mobility transistor (HEMT). The engineered substrate may include a polycrystalline ceramic core, a barrier layer encapsulating the polycrystalline ceramic core, a bonding layer coupled to the barrier layer, and a substantially single crystalline silicon layer coupled to the bonding layer. The buffer layer may include at least one of AlN, AlGaN, or AlN/AlGaN.

According to some other embodiments of the present invention, a method for making a multilayered device on an engineered substrate having a substrate coefficient of thermal expansion includes growing a buffer layer on the engineered substrate, and growing a first epitaxial layer coupled to the buffer layer. The first epitaxial layer is characterized by an epitaxial coefficient of thermal expansion substantially equal to the substrate coefficient of thermal expansion. The method further includes growing an aluminum gallium nitride (AlGaN) back barrier layer coupled to the first epitaxial layer, growing an undoped gallium nitride (GaN) layer coupled to the AlGaN back barrier layer, and growing a barrier layer coupled to the undoped GaN layer.

According to some further embodiments, an epitaxial semiconductor structure includes an engineered substrate having a substrate coefficient of thermal expansion, a buffer layer formed on the engineered substrate, and a first epitaxial layer formed on the buffer layer. The first epitaxial layer is characterized by an epitaxial coefficient of thermal expansion substantially equal to the substrate coefficient of thermal expansion.

DETAILED DESCRIPTION OF SPECIFIC EMBODIMENTS

The present invention relates generally to power devices formed on engineered substrates. More specifically, the present invention relates to methods and systems suitable for fabricating power devices using epitaxial growth processes. Merely by way of example, the invention has been applied to a method and system for fabricating power devices on a substrate by epitaxial growth, wherein the substrate is characterized by a coefficient of thermal expansion (CTE) that is substantially matched to epitaxial layers that form the power devices. The methods and techniques can be applied to a variety of semiconductor processing operations.

Figure 1:
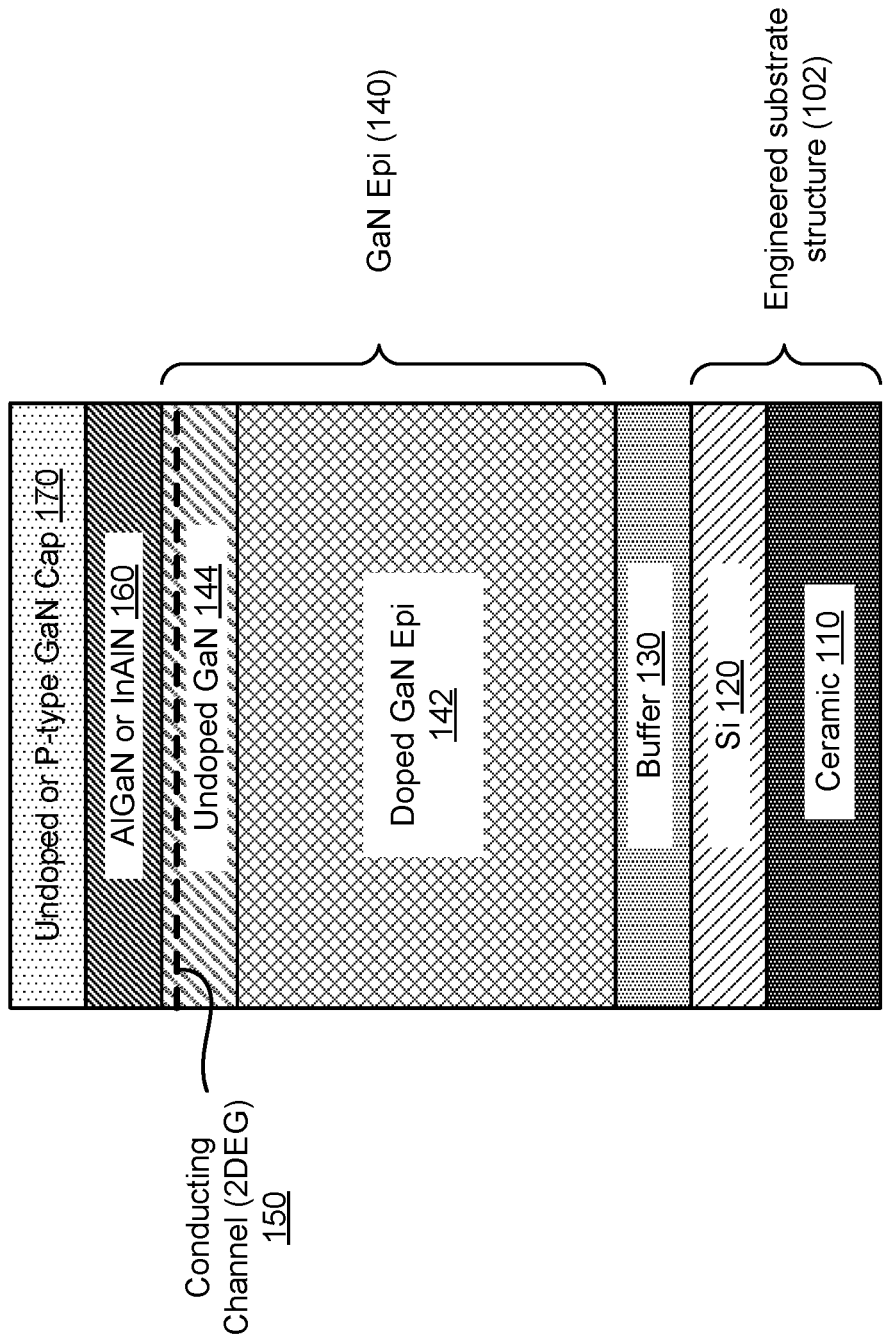
FIG. 1 is a simplified schematic cross-sectional diagram illustrating a power device formed on an engineered substrate structure according to an embodiment of the present invention.

FIG. 1 is a simplified schematic cross-sectional diagram illustrating a power device formed on an engineered substrate structure 102 according to an embodiment of the present invention. The engineered substrate structure 102 may include a ceramic substrate 110 with a thin silicon (Si) layer 120 formed thereon. The silicon layer 120 may provide a surface for subsequent epitaxial growth. The ceramic substrate 110 may have a CTE that is substantially matched to the CTE of one or more subsequent epitaxial layers.

A buffer layer 130 may be epitaxially formed on the Si layer 120. The buffer layer 130 may include one or more layers. In some embodiments, the buffer layer 130 may be relatively thin, for example less than 0.5 micron in thickness. The buffer layer 130 may include, for example, AlN about 0.2 μm in thickness, $Al_{0.25}Ga_{0.75}N$ about 0.125 μm in thickness, combinations thereof, or the like. A relatively thin aluminum-containing buffer layer (e.g., 0.2 μm AlN/0.125 μm $Al_{0.25}Ga_{0.75}N$) can support more than 8 microns of GaN epitaxy on a large diameter substrate, which cannot be fabricated using silicon substrates.

A GaN epitaxial layer 140 may be formed on the buffer layer 130. In some embodiments, the GaN epitaxial layer 140 may have a thickness that is greater than 8 μm for high voltage resistance. For example, a breakdown voltage greater than 500 V or 600 V may be achieved in the power devices subsequently formed on the GaN epitaxial layer 140. As illustrated in FIG. 1, the GaN epitaxial layer 140 may include a doped GaN epitaxial layer 142 and an undoped GaN epitaxial layer 144 beneath (e.g., immediately beneath) the conducting channel 150. The doped GaN epitaxial layer 142 may have a thickness of 5 μm or greater. The doped GaN epitaxial layer 142 may include C— or Fe-doped GaN in some embodiments to provide for high resistance. As discussed more fully herein, low conductivity layers can be formed such as C—GaN or Fe—GaN layers, which may have background doping levels (free carriers density) on the order of $1 \times 10^{12}$ cm$^{-3}$ as the carbon or iron compensates for the background impurities or provides deep centers.

Although GaN layers are discussed herein, the present invention is not limited to GaN and other III-V materials can be utilized, including AlGaN, InGaN, InAlGaN, combinations thereof, and the like. One of ordinary skill in the art would recognize many variations, modifications, and alternatives.

An AlGaN or InAlN layer 160 may be formed on the GaN epitaxial layer 140 as the barrier layer. The AlGaN/GaN interface may result in a two-dimensional electron gas (2DEG) due to polarization induced charge at the heterointerface. The two-dimensional electron gas forms a conduction channel 150 of a high-electron-mobility transistor (HEMT) power device.

In some embodiments, an optional undoped or p-type GaN cap layer 170 may be formed on the AlGaN or InAlN layer 160 as appropriate to fabricate enhancement-mode devices.

Because the ceramic substrate 110 may have a CTE that is substantially matched to the CTE of the GaN epitaxial layer, a relatively thin buffer layer 130 (e.g., less than 0.5 μm) can support a relative thick GaN epitaxial layer 140 (e.g., more than 5 μm).

Figure 2:
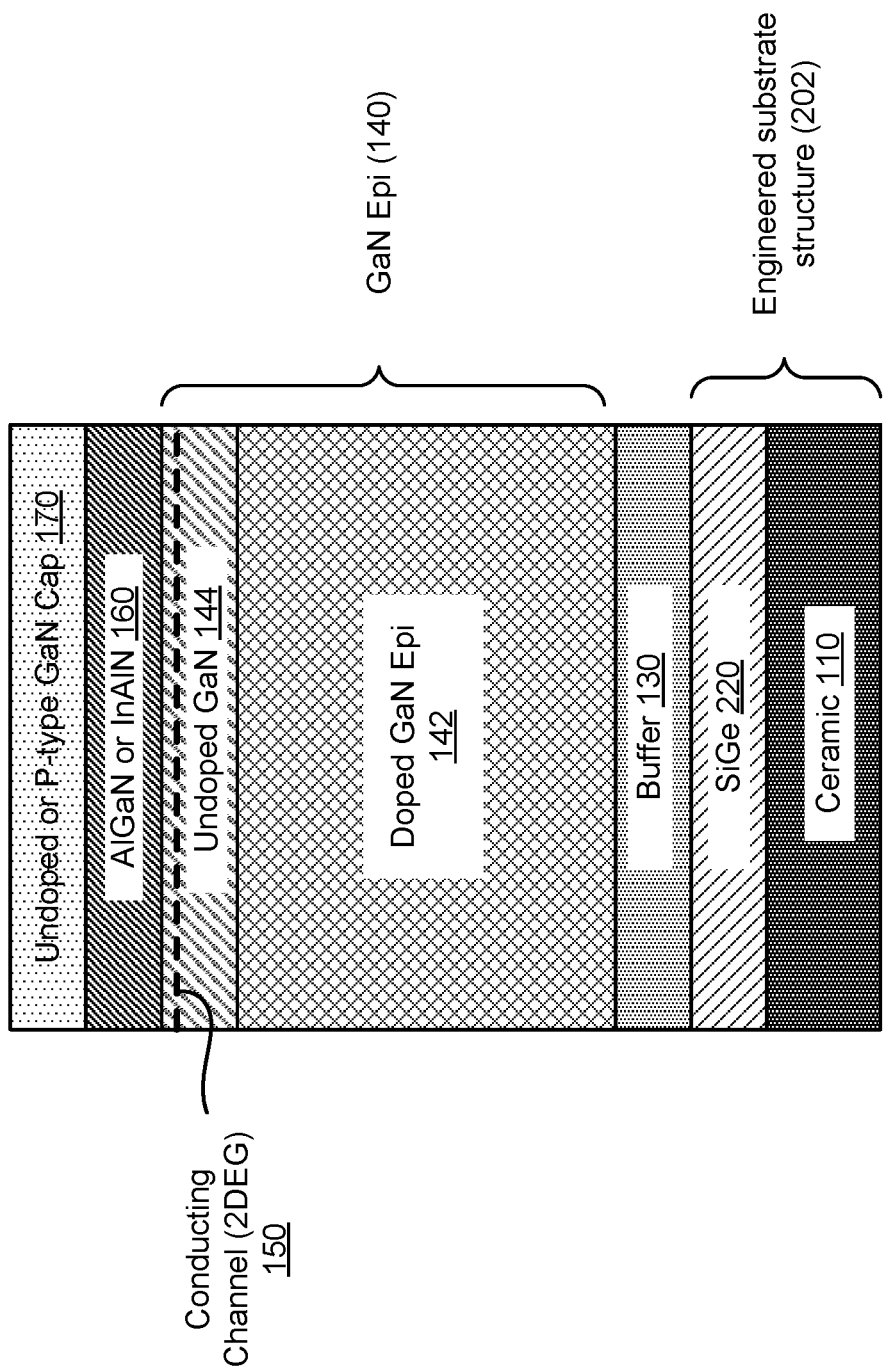
FIG. 2 is a simplified schematic cross-sectional diagram illustrating a power device formed on an engineered substrate structure according to another embodiment of the present invention.

FIG. 2 is a simplified schematic cross-sectional diagram illustrating a power device formed on an engineered substrate structure 202 according to an embodiment of the present invention. The engineered substrate structure 202 may include a ceramic substrate 110 with a thin silicon germanium (SiGe) layer 220 formed thereon. The silicon germanium layer 220 may provide a lattice-matched surface for subsequent epitaxial growth. The ceramic substrate 110 may have a CTE that is substantially matched to the CTE of subsequent epitaxial layers. The SiGe layer 220 may be epitaxially grown on a Si layer (not shown), or may be transferred from a donor substrate (e.g., by bonding the donor substrate with a SiGe layer formed thereon with the ceramic substrate).

A buffer layer 130 may be epitaxially formed on the SiGe layer 220. The buffer layer 130 may include one or more layers. In some embodiments, the buffer layer 130 may be relatively thin, for example less than 0.5 micron in thickness. The buffer layer 130 may include, for example, AlN about 0.2 μm in thickness, $Al_{0.25}Ga_{0.75}N$ about 0.125 μm in thickness, combinations thereof, or the like. A relatively thin aluminum-containing buffer layer 130 (e.g., 0.2 μm AlN/ 0.125 μm $Al_{0.25}Ga_{0.75}N$) can support more than 8 microns of GaN epitaxy on a large diameter substrate, which cannot be fabricated using silicon substrates.

A GaN epitaxial layer 140 may be formed on the buffer layer 130. In some embodiments, the GaN epitaxial layer 140 may have a thickness that is greater than 8 μm for high voltage resistance. For example, a breakdown voltage greater than 500 V or 600 V may be achieved in the power devices subsequently formed on the GaN epitaxial layer. As illustrated in FIG. 2, the GaN epitaxial layer can include, for example, 5 μm of doped epitaxial layer 142 and an undoped GaN layer 144 beneath (e.g., immediately beneath) the conducting channel 150. The doped epitaxial layer 142 may include C— or Fe-doped GaN in some embodiments. Although GaN layers are discussed herein, the present invention is not limited to GaN and other III-V materials can be utilized, including AlGaN, InGaN, InAlGaN, combinations thereof, and the like. One of ordinary skill in the art would recognize many variations, modifications, and alternatives.

An AlGaN or InAlN layer 160 may be formed on the GaN epitaxial layer 140 as the barrier layer. The AlGaN/GaN interface may result in a two-dimensional electron gas (2DEG) due to polarization induced charge at the heterointerface. The two-dimensional electron gas forms a conduction channel 150 of a high-electron-mobility transistor (HEMT) power device.

In some embodiments, an optional undoped or p-type GaN cap layer 170 may be formed on the AlGaN or InAlN layer 160 as appropriate to fabricate enhancement-mode devices.

Figure 3:
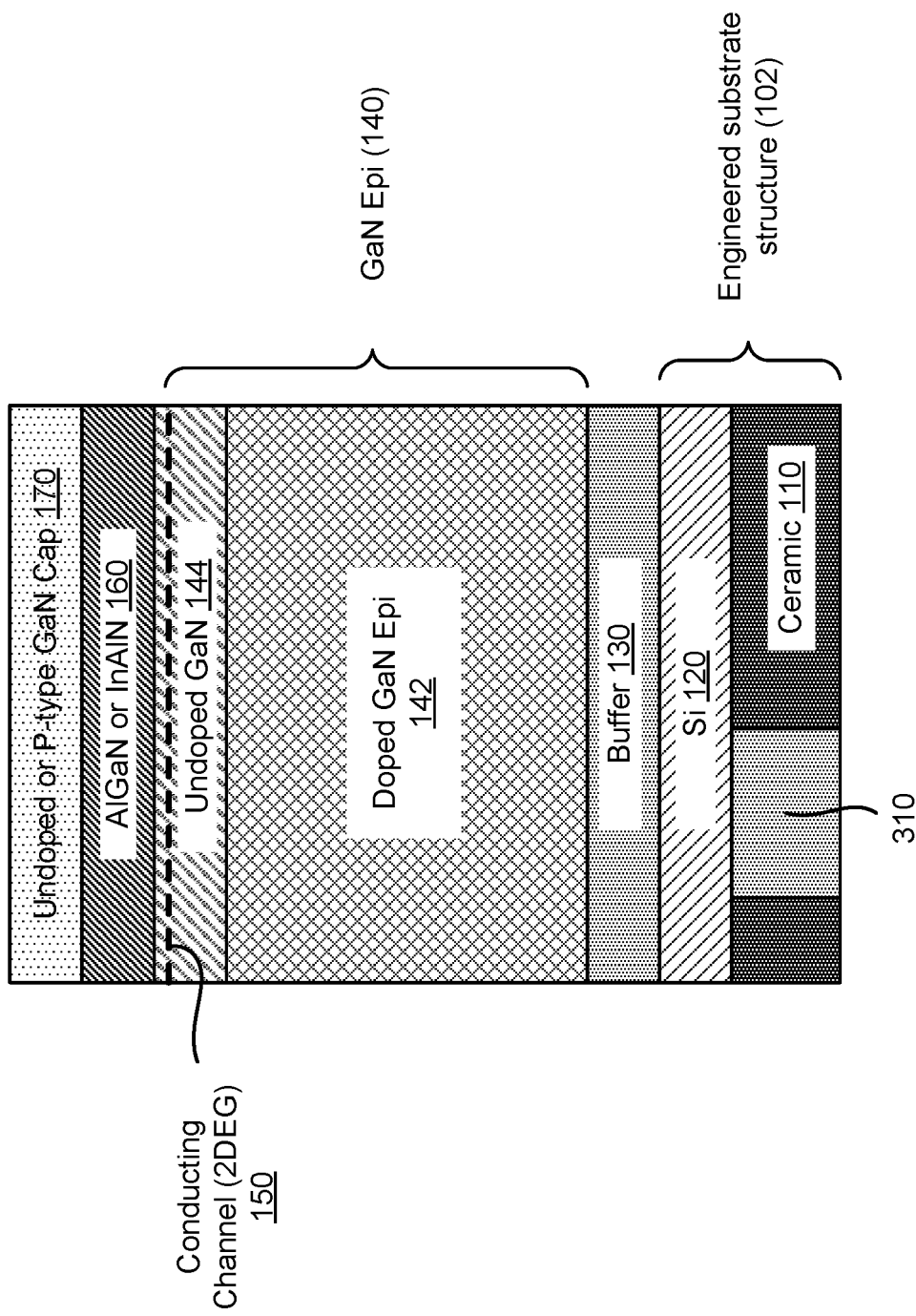
FIG. 3 is a simplified schematic cross-sectional diagram illustrating a power device formed on an engineered substrate structure with a back-side contact according to an embodiment of the present invention.

FIG. 3 is a simplified schematic cross-sectional diagram illustrating a power device formed on an engineered substrate structure 102 according to an embodiment of the present invention. The engineered substrate structure 102 may include a ceramic substrate 110 with a thin Si layer 120 formed thereon. The Si layer 120 may provide a surface for subsequent epitaxial growth. The ceramic substrate 110 may have a CTE that is substantially matched to the CTE of subsequent epitaxial layers.

The power device may further include a buffer layer 130 epitaxially formed on the Si layer 120, a GaN epitaxial layer 140 formed on the buffer layer 130, and an AlGaN or InAlN barrier layer 160 formed on GaN epitaxial layer 140, substantially similar to the power device illustrated in FIG. 1. The GaN epitaxial layer 140 may include a 5 μm of doped epitaxial layer 142 and an undoped GaN layer 144 beneath (e.g., immediately beneath) the conducting channel 150. The GaN epitaxial layer 140 may also include one or more conducting epitaxial layers below the doped epitaxial layer (e.g., as illustrated in FIG. 4).

The power device may further include an electrical contact 310 to the Si layer 120 or the GaN epitaxial layer 140 formed through the ceramic substrate 110. During operation of the power device, some parasitic charges may accumulate in the Si layer 120 and/or the buffer layer 130, resulting in a parasitic capacitance. The electrical contact 310 may facilitate the removal of parasitic charges, thereby enabling faster switching of the power device.

Figure 4:
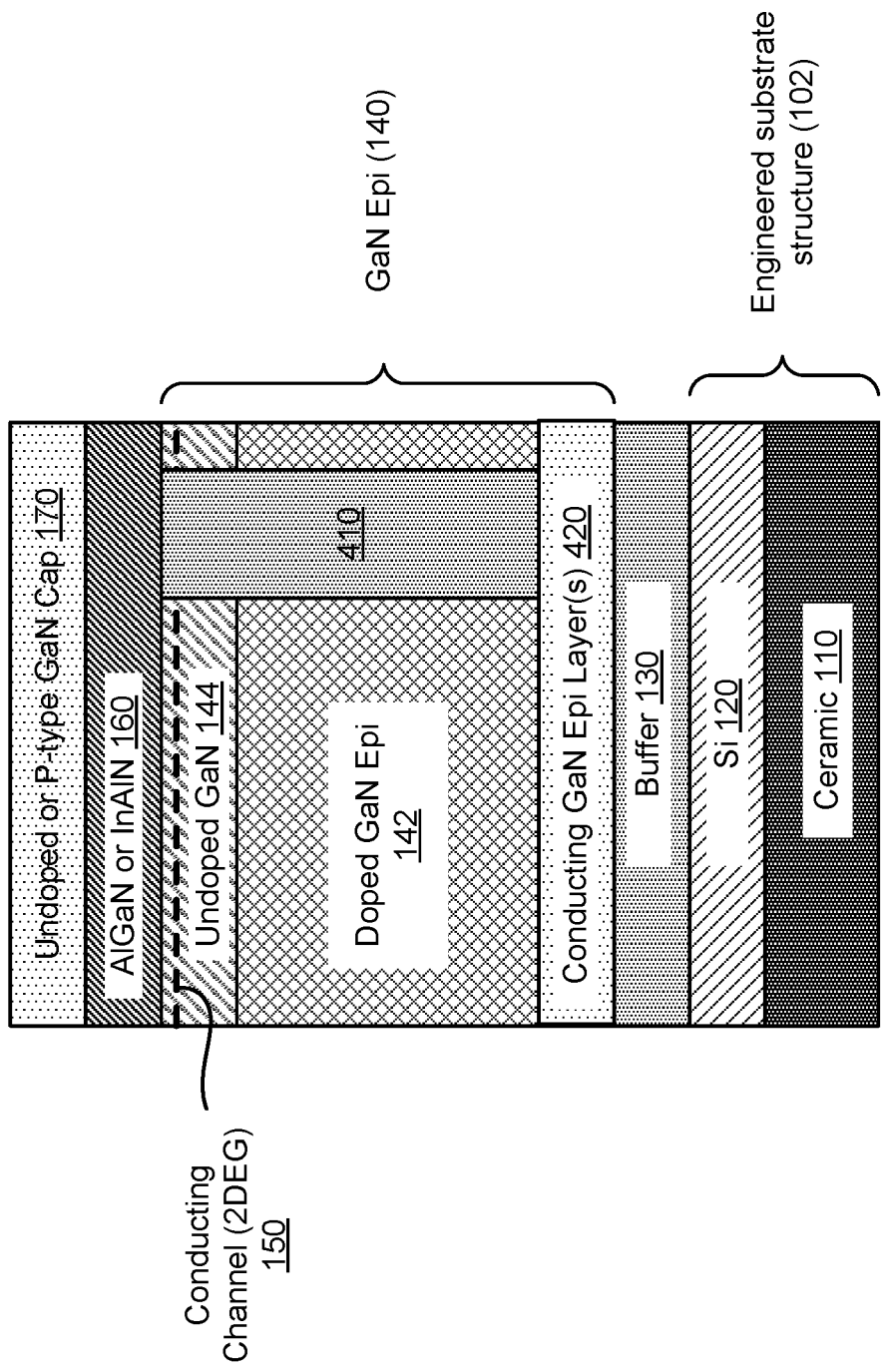
FIG. 4 is a simplified schematic cross-sectional diagram illustrating a power device formed on an engineered substrate structure with a front-side contact according to an embodiment of the present invention.

FIG. 4 is a simplified schematic cross-sectional diagram illustrating a power device formed on an engineered substrate structure 102 according to an embodiment of the present invention. The engineered substrate structure 102 may include a ceramic substrate 110 with a thin silicon (Si) layer 120 formed thereon. The silicon layer 120 may provide a surface for subsequent epitaxial growth. The ceramic substrate 110 may have a CTE that is substantially matched to the CTE of subsequent epitaxial layers.

A GaN epitaxial layer 140 may be formed on the buffer layer 130. In some embodiments, the GaN epitaxial layer 140 may have a thickness that is greater than 8 μm for high voltage resistance. For example, a breakdown voltage greater than 500 V or 600 V may be achieved in the power devices subsequently formed on the GaN epitaxial layer 140. As illustrated in FIG. 4, the GaN epitaxial layer 140 can include, for example, a conducting GaN epitaxial layer 420, a doped GaN epitaxial layer 142, and an undoped GaN layer 144 beneath (e.g., immediately beneath) the conducting channel 150. The doped epitaxial layer 142 may include C— or Fe-doped GaN in some embodiments. Although GaN layers are discussed herein, the present invention is not limited to GaN and other III-V materials can be utilized, including AlGaN, InGaN, InAlGaN, combinations thereof, and the like. One of ordinary skill in the art would recognize many variations, modifications, and alternatives.

An AlGaN or InAlN layer 160 may be formed on the GaN epitaxial layer 140 as the barrier layer. The AlGaN/GaN interface may result in a two-dimensional electron gas (2DEG) due to polarization induced charge at the heterointerface. The two-dimensional electron gas forms a conduction channel 150 of a high-electron-mobility transistor (HEMT) power device.

In some embodiments, an optional undoped or p-type GaN cap layer 170 may be formed on the AlGaN or InAlN layer 160 as appropriate to fabricate enhancement-mode devices.

The power device may further include an electrical contact 410 to the Si layer 120 or the GaN epitaxial layer 140 formed through the front side of the power device. Although FIG. 4 shows the electrical contact extends through the GaN epitaxial layer 140 to the buffer layer 130, the electrical contact can extend to the Si layer 120 in some embodiments. The electrical contact may be insulated on its side wall so that it is not electrically connected to the AlGaN or InAlN layer 160 and the GaN epitaxial layer 140. The electrical contact 410 may facilitate the removal of parasitic charges, thereby enabling faster switching of the power device.

Figure 5:
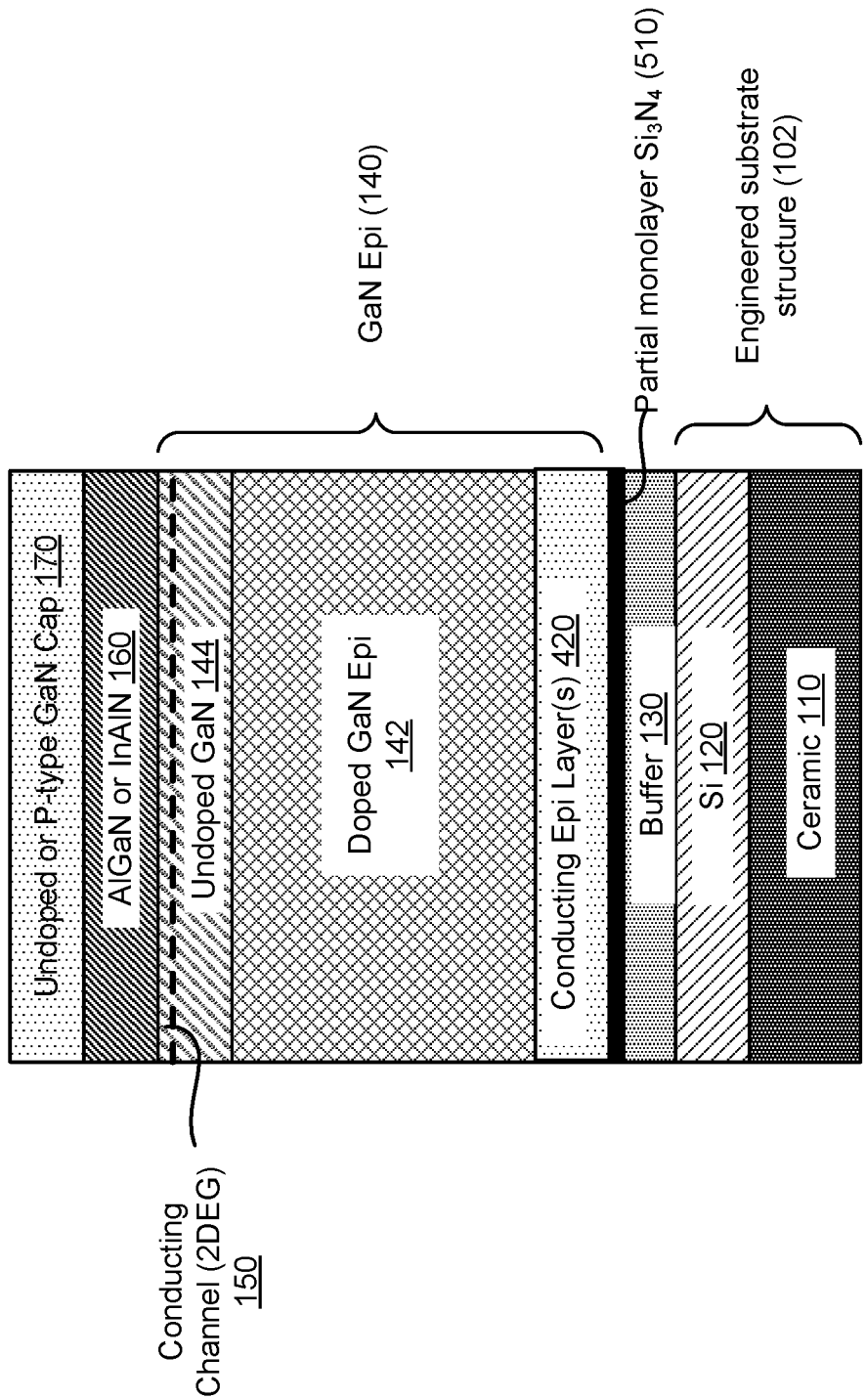
FIG. 5 is a simplified schematic cross-sectional diagram illustrating a power device formed on an engineered substrate structure according to an embodiment of the present invention.

FIG. 5 is a simplified schematic cross-sectional diagram illustrating a power device formed on an engineered substrate structure 102 according to another embodiment of the present invention. The engineered substrate 102 may include a ceramic substrate 110 with a thin silicon (Si) layer 120 formed thereon. The silicon layer 120, which may be a single crystal layer, may provide a surface for subsequent epitaxial growth. The ceramic substrate 110 may have a CTE that is substantially matched to the CTE of one or more of the subsequent epitaxial layers.

As illustrated in FIG. 5, a partial monolayer of SiN 510 may be inserted to promote dislocation reduction with 3D growth. The use of an engineered substrate 102 may enable reductions in the compressive stress in the epitaxial layers due to the use of the polycrystalline ceramic core substrate 110. As illustrated in FIG. 5, the partial monolayer of SiN 510 may provide SiN islands that are utilized in a lateral overgrowth process to reduce dislocation density and improve crystal quality. Additional description is provided in U.S. Pat. No. 9,012,253, issued on Apr. 21, 2015, the disclosure of which is hereby incorporated by reference in its entirety for all purposes.

The partial monolayer of SiN 510 may cover portions of the buffer layer 130 and provide tensile stress for the GaN epitaxial growth. Regrowth of GaN on the partial monolayer of SiN 510 may result in nucleation between the SiN islands and lateral overgrowth over the SiN islands, resulting in termination of dislocations and improved crystal quality. Although SiN islands are discussed herein, other partial layers can be utilized including arrays of SiN stripes and the like. Additionally, the SiN does not need to be formed as a monolayer, but can have a predetermined thickness greater than a monolayer. In addition to SiN, other materials can be utilized in the lateral overgrowth process, including $SiO_2$, and the like.

In some embodiments, multiple partial monolayers are utilized. In these embodiments, a first partial monolayer is formed, a first lateral overgrowth is performed, a second partial monolayer is formed, a second lateral overgrowth is performed, and the monolayer/regrowth structure can repeated a predetermined number of times to provide multiple interlayers. The thickness of the lateral overgrowth layer can vary, for example, from 0.5 μm to 2.5 μm in some embodiments. As the lateral overgrowth layers become successively more planar and characterized by a reduced number of defects and/or dislocations, the partial monolayer 510 may provide an improved surface for subsequent lateral overgrowth layers, which may increase or decrease in thickness as appropriate to the particular application.

In some embodiments, the conductive epitaxial layer 520 formed on the partial monolayer of SiN 510 can be undoped GaN (u-GaN) characterized by low doping densities on the order of $1 \times 10^{16}$ cm$^{-3}$, in designs that provide high resistance layers as elements of the total epitaxial structure.

Figure 6:
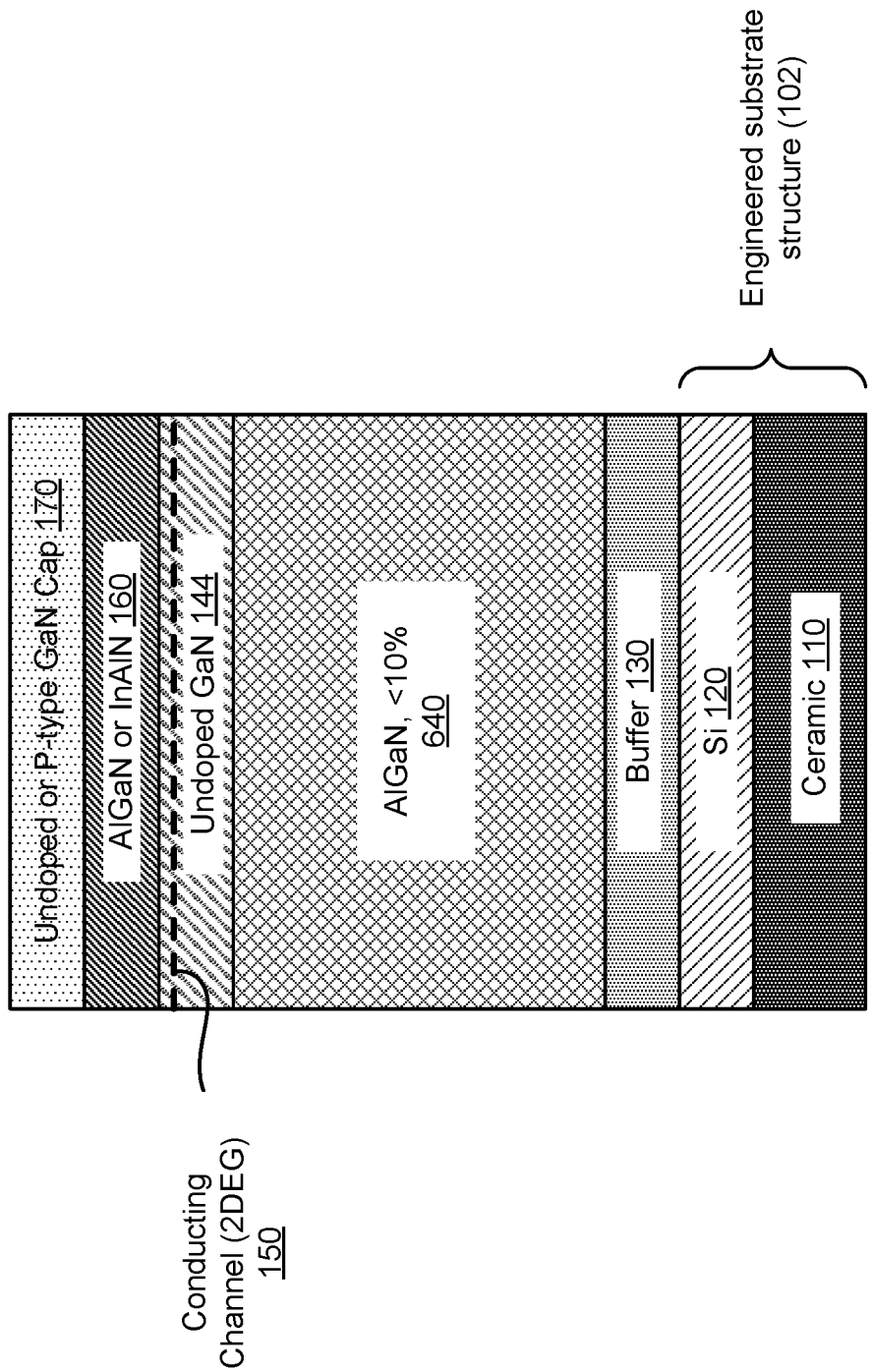
FIG. 6 is a simplified schematic cross-sectional diagram illustrating a power device formed on an engineered substrate structure according to another embodiment of the present invention.

FIG. 6 is a simplified schematic cross-sectional diagram illustrating a power device formed on an engineered substrate structure 102 according to another embodiment of the present invention. The engineered substrate 102 may include a ceramic substrate 110 with a thin silicon (Si) layer 120 formed thereon. The silicon layer 120, which may be a single crystal layer, provides a surface for subsequent epitaxial growth. The ceramic substrate 110 may have a CTE that is substantially matched to the CTE of one or more of the subsequent epitaxial layers.

As illustrated in FIG. 6, an Al$_x$Ga$_{1-x}$N epitaxial layer 640 with a predetermined aluminum mole fraction (x) extends from the buffer layer 130 to the undoped GaN layer 144 beneath the channel 150. The aluminum mole fraction can be low, for example, less than 10%, to provide the desired carrier confinement. In other embodiments, the aluminum mole fraction may range from 10% to 30%. The Al$_x$Ga$_{1-x}$N epitaxial layer 640 may be doped with iron or carbon to further increase the resistivity of this epitaxial layer, which may serve as an insulating or blocking layer. The bandgap difference between AlGaN and GaN may provide an additional barrier to breakdown.

Figure 7:
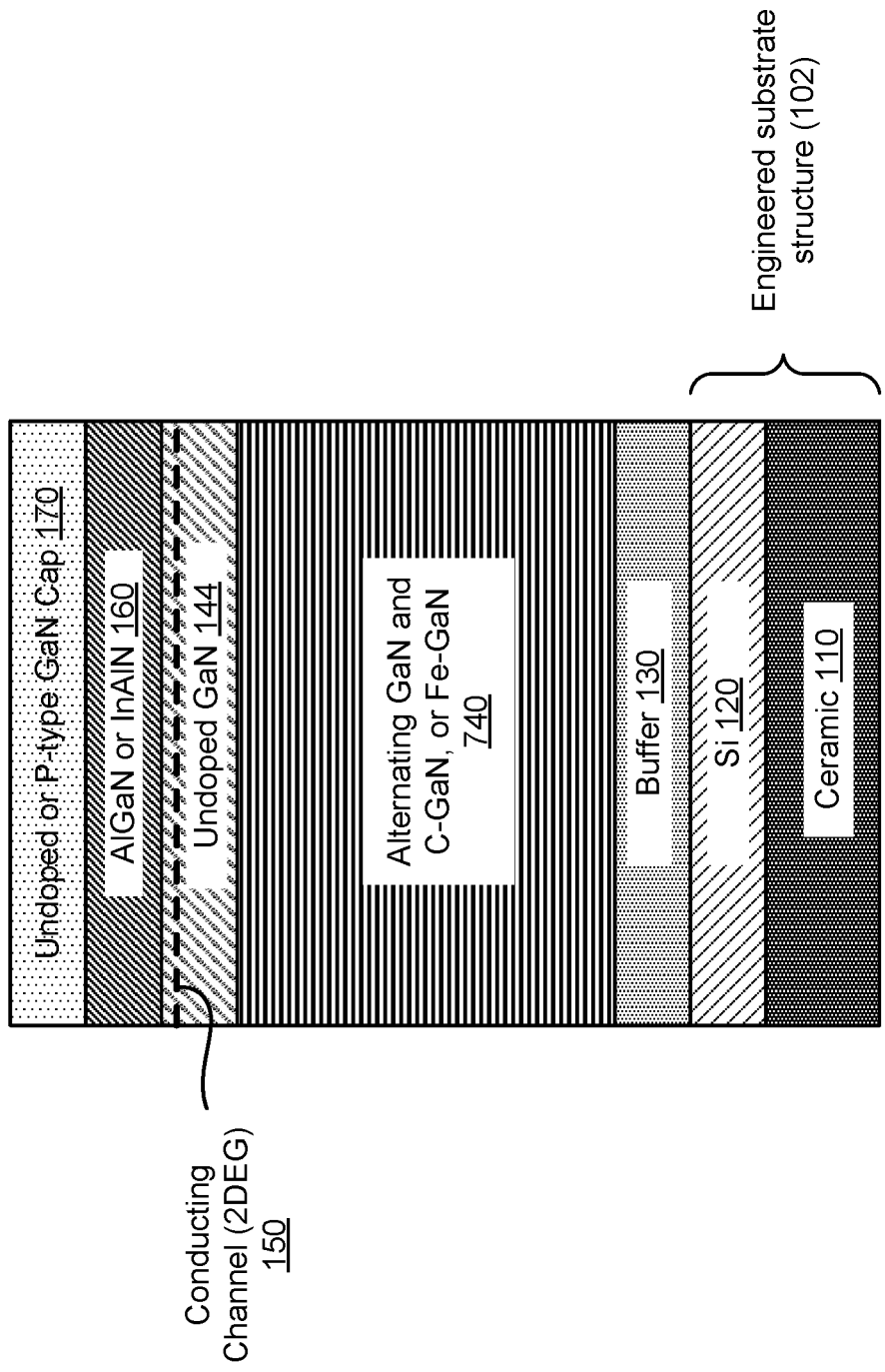
FIG. 7 is a simplified schematic cross-sectional diagram illustrating a power device formed on an engineered substrate structure according to a further embodiment of the present invention.

FIG. 7 is a simplified schematic cross-sectional diagram illustrating a power device formed on an engineered substrate structure 102 according to another embodiment of the present invention. The engineered substrate 102 may include a ceramic substrate 110 with a thin silicon (Si) layer 120 formed thereon. The silicon layer 120, which may be a single crystal layer, may provide a surface for subsequent epitaxial growth. The ceramic substrate 110 may have a CTE that is substantially matched to the CTE of one or more of the subsequent epitaxial layers.

In FIG. 7, an epitaxial structure 740 is formed by growing alternating layers of C—GaN (or Fe—GaN) and undoped GaN (u-GaN) layers to provide high resistance with improved crystal quality. Since u-GaN is typically grown at higher temperatures compared to C—GaN or Fe—GaN, the presence of the u-GaN in the superlattice can result in higher crystal quality since higher growth temperatures are typically associated with higher quality crystals. Thus, this structure maintains the insulating properties of the epitaxial layer that provide high breakdown performance while improving the crystal quality. In some embodiments, the u-GaN has a background doping level on the order of $1 \times 10^{16}$ cm$^{-3}$ as a result of incorporation of dopants present in the growth chamber, even in the absence of intentional doping. These layers with low conductivity can be combined with the C—GaN or Fe—GaN layers in the superlattice, with the C—GaN or Fe—GaN layers have background doping levels (free carriers density) on the order of $1 \times 10^{12}$ cm$^{-3}$ as the carbon or iron compensates for the background impurities. Thus, the superlattice may provide a high resistance and high quality crystal.

FIG. 8A is a simplified schematic cross-sectional diagram illustrating a power device formed on an engineered substrate structure 102 according to another embodiment of the present invention. The engineered substrate 102 may include a ceramic substrate 110 with a thin silicon (Si) layer 120 formed thereon. The silicon layer 120, which may be a single crystal layer, may provide a surface for subsequent epitaxial growth. The ceramic substrate 102 may have a CTE that is substantially matched to the CTE of one or more of the subsequent epitaxial layers. A buffer layer 130 may be epitaxially formed on the Si layer 120. An unintentionally doped GaN (UID-GaN) epitaxial layer 840 (or alternating layers of C—GaN (or Fe—GaN) and undoped GaN (uGaN) layers) may be formed on the buffer layer 130, as discussed above with reference to FIGS. 1 and 7.

Still referring to FIG. 8A, an undoped low composition AlGaN layer 810 may be formed on the UID-GaN layer 840 (or alternating layers of C—GaN (or Fe—GaN) and uGa) layers). The undoped low composition AlGaN layer 810 may be referred to as a back barrier layer. An undoped GaN layer 144 may be formed on the undoped low composition AlGaN layer 810. An AlGaN (or InGaN) layer 160 may be formed on the undoped GaN layer 810. The AlGaN (or InGaN) layer 160 may be referred to as a barrier layer. The AlGaN/GaN interface may result in a two-dimensional electron gas (2DEG) due to polarization induced charge at the hetero-interface. The two-dimensional electron gas forms a conducting channel 150 of a high-electron-mobility transistor (HEMT) power device. The addition of the low composition AlGaN layer 840 (i.e., the back barrier layer) may increase the retention of electrons in the conducting channel 150 and prevent them from penetrating into the UID-GaN layer 840 (or alternating layers of C—GaN (or Fe—GaN) and uGa) layers) as a leakage current, as discussed below.

Figure 9B:
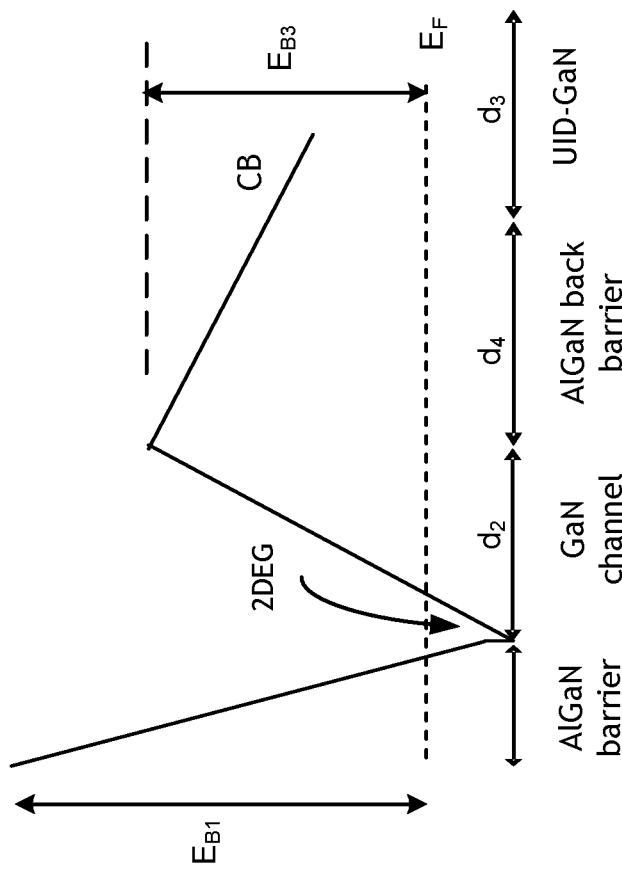
FIG. 9B illustrates an exemplary conduction band diagram of a HEMT with an AlGaN back barrier layer according to some other embodiments.
Figure 9A:
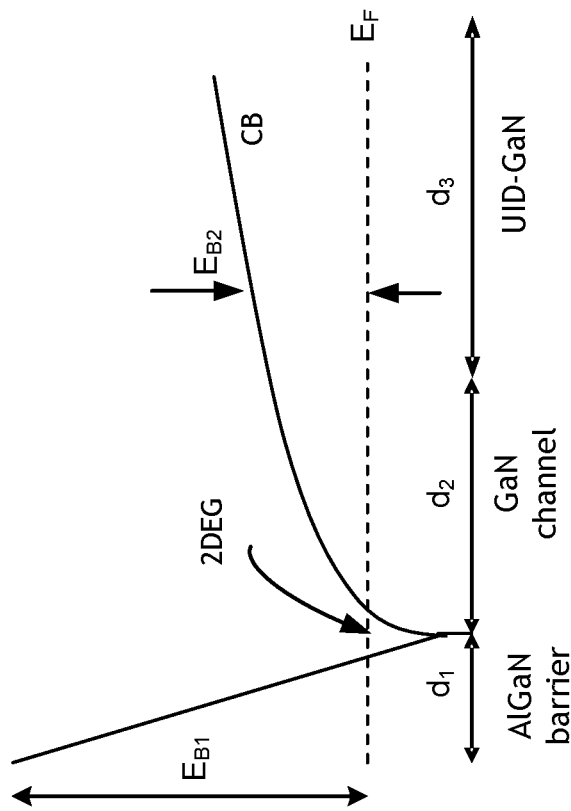
FIG. 9A illustrates an exemplary conduction band diagram of a HEMT without an AlGaN back barrier layer according to some embodiments.

FIG. 9A illustrates an exemplary conduction band (CB) diagram of a HEMT without a back barrier layer according to some embodiments. The AlGaN barrier layer 160 may have an aluminum mole fraction ranging from about 10% to about 100%, and a thickness $d_1$ ranging from about 1 nm to about 100 nm. The GaN layer 144 (i.e., the channel) may have a thickness $d_2$ ranging from about 10 nm to about 100 nm. The UID-GaN layer 840 may have a thickness $d_3$ that is greater than about 8 μm for high voltage resistance as discussed above. As illustrated in FIG. 9A, the conduction band of the AlGaN barrier layer 160 may form a first barrier height $E_{B1}$ with respect to the Fermi level ($E_F$), which may range from about 1 eV to about 4 eV. The conduction band of the UID-GaN layer 840 may form a second barrier height $E_{B2}$ with respect to the Fermi level ($E_F$), which may be substantially lower than the first barrier height $E_{B1}$. In some embodiments, EB$_2$ can range from 0.2 eV to 1.5 eV. Thus, electrons in the channel (2DEG) 150 may easily penetrate into the UID-GaN layer 840, thereby resulting in leakage current.

FIG. 9B illustrates an exemplary conduction band (CB) diagram of a HEMT with a low composition AlGaN back barrier layer 810 according to another embodiment. Elements illustrated with respect to FIG. 9A are not repeated here for purposes of clarity. The low composition AlGaN back barrier layer 810 may have an aluminum mole fraction ranging from about 1% to about 50%, for example, about 3% to about 15%, and a thickness $d_4$ ranging from about 0.1 μm to about 1 μm, for example, from about 0.2 μm to about 0.3

μm. In some embodiments, the AlGaN back barrier layer 810 may be undoped. As illustrated, the low composition AlGaN back barrier layer 810 may form a third barrier height $E_{B3}$ with respect to the Fermi level ($E_F$) that is relatively high as compared to the second barrier height $E_{B2}$ formed by the UID-GaN layer 840 without the low composition AlGaN back barrier layer 810, as illustrated in FIG. 9A. In some embodiments, $EB_3$ can range from 1 to 3 eV. Thus, the addition of the low composition AlGaN back barrier layer 810 may prevent electrons in the channel (2DEG) from penetrating into the UID-GaN layer, thereby reducing the leakage current through the substrate.

Figure 10:
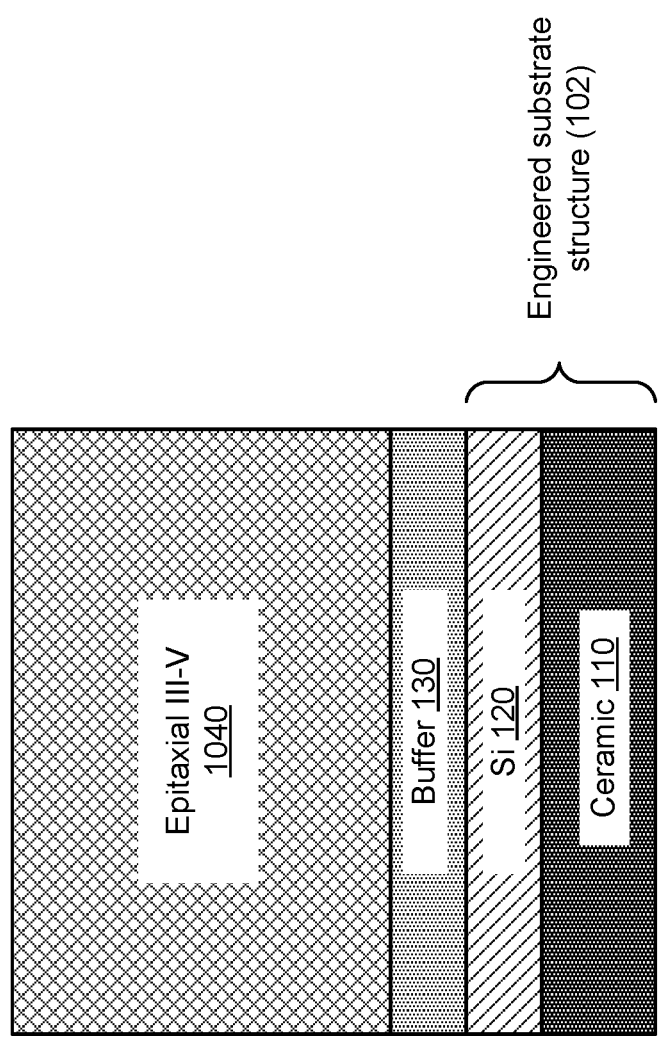
FIG. 10 is a simplified schematic cross-sectional diagram illustrating a substrate structure suitable for use in the fabrication of power devices according to an embodiment of the present invention.

FIG. 10 is a simplified schematic cross-sectional diagram illustrating a substrate structure 102 suitable for use in the fabrication of power devices according to an embodiment of the present invention. Referring to FIG. 10, an engineered substrate 102, which can include elements illustrated in FIG. 11, including a polycrystalline ceramic core 110, may be provided. A single crystal layer 120 (e.g., single crystal silicon) is joined to the polycrystalline ceramic core 110, for example, using a layer transfer process, to provide a single crystal growth surface. A buffer layer 130 may be grown on the single crystal layer 120 and a III-V epitaxial layer 1040 (e.g., GaN) is grown on the buffer layer 130. The CTE of the III-V epitaxial layer 1040 may be substantially matched to the CTE of the core of the polycrystalline ceramic core 110. The III-V epitaxial layer 1040 can be single crystal, with high quality resulting, in part, from the CTE matching.

Figure 11:
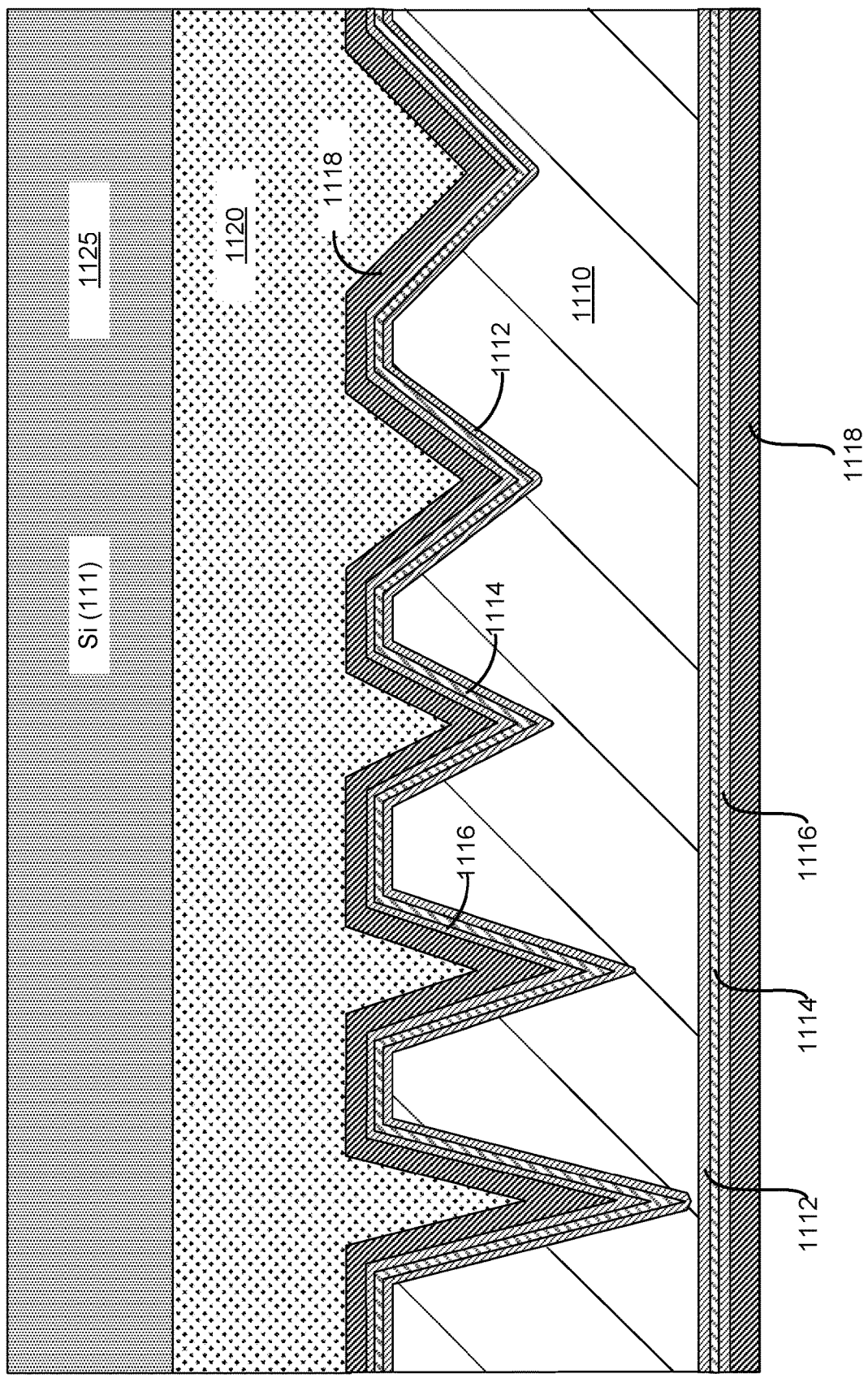
FIG. 11 is a simplified schematic cross-sectional diagram illustrating an engineered substrate structure according to an embodiment of the present invention.

FIG. 11 is a simplified schematic diagram illustrating an engineered substrate structure according to some embodiments of the present invention. As illustrated in FIG. 11, the engineered substrate structure may be suitable for a variety of electronic and optical applications. The engineered substrate structure includes a core 1110 (e.g., AlN Substrate) that can have a coefficient of thermal expansion (CTE) that is substantially matched to the CTE of the epitaxial material that will be grown on the engineered substrate structure, for example, on the exfoliated silicon (111) layer 1125.

For applications including the growth of gallium nitride (GaN)-based materials (epitaxial layers including GaN-based layers), the core 1110 can be a polycrystalline ceramic material, for example, polycrystalline aluminum nitride (AlN), which can include a binding material such as yttrium oxide. Other materials can be utilized in the core, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 1110 can be on the order of 100 to 1,500 μm, for example, 750 μm. The core 1110 is encapsulated in an adhesion layer 1112 that can be referred to as a shell or an encapsulating shell. In an embodiment, the adhesion layer 1112 comprises a tetraethyl orthosilicate (TEOS) oxide layer on the order of 1,000 Å in thickness. In other embodiments, the thickness of the adhesion layer 1112 varies, for example, from 100 Å to 2,000 Å. Although TEOS oxides are utilized for adhesion layers 1112 in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. The adhesion layer 1112 completely surrounds the core 1110 in some embodiments to form a fully encapsulated core 1110 and can be formed using an LPCVD process or other suitable deposition processes, which can be compatible with semiconductor processing and in particular with polycrystalline or composite substrates and layers. The adhesion layer 1112 provides a surface on which subsequent layers adhere to form elements of the engineered substrate structure.

In addition to the use of LPCVD processes, spin on glass/dielectrics, furnace-based processes, and the like to form the encapsulating adhesion layer, other semiconductor processes can be utilized according to embodiments of the present invention, including CVD processes or similar deposition processes. As an example, a deposition process that coats a portion of the core 1110 can be utilized, the core 1110 can be flipped over, and the deposition process could be repeated to coat additional portions of the core 1110. Thus, although LPCVD techniques are utilized in some embodiments to provide a fully encapsulated structure, other film formation techniques can be utilized depending on the particular application.

Referring to FIG. 11, a conductive layer 1114 is formed surrounding the adhesion layer 1112. In an embodiment, the conductive layer 1114 is a shell of polysilicon (i.e., polycrystalline silicon) that is formed surrounding the adhesion layer 1112 since polysilicon can exhibit poor adhesion to ceramic materials. In embodiments in which the conductive layer 1114 is polysilicon, the thickness of the polysilicon layer can be on the order of 500-5,000 Å, for example, 2,500 Å. In some embodiments, the polysilicon layer can be formed as a shell to completely surround the adhesion layer 1112 (e.g., a TEOS oxide layer), thereby forming a fully encapsulated adhesion layer 1112, and can be formed using an LPCVD process. In other embodiments, as discussed below, the conductive material can be formed on a portion of the adhesion layer 1112, for example, a lower half of the substrate structure. In some embodiments, conductive material can be formed as a fully encapsulating layer and subsequently removed on one side of the substrate structure.

In an embodiment, the conductive layer 1114 can be a polysilicon layer doped to provide a highly conductive material, for example, doped with boron to provide a p-type polysilicon layer. In some embodiments, the doping with boron is at a level of $1\times10^{19}$ cm$^{-3}$ to $1\times10^{20}$ cm$^{-3}$ to provide for high conductivity. Other dopants at different dopant concentrations (e.g., phosphorus, arsenic, bismuth, or the like at dopant concentrations ranging from $1\times10^{16}$ cm$^{-3}$ to $5\times10^{18}$ cm$^{-3}$) can be utilized to provide either n-type or p-type semiconductor materials suitable for use in the conductive layer 1114. One of ordinary skill in the art would recognize many variations, modifications, and alternatives.

The presence of the conductive layer 1114 is useful during electrostatic chucking of the engineered substrate to semiconductor processing tools, for example tools with electrostatic chucks (ESC or e-chuck). The conductive layer enables rapid dechucking after processing in the semiconductor processing tools. In embodiments of the present invention, the conductive layer 1114 enables electrical contact with the chuck or capacitive coupling to the e-chuck during future processing including bonding. Thus, embodiments of the present invention provide substrate structures that can be processed in manners utilized with conventional silicon wafers. One of ordinary skill in the art would recognize many variations, modifications, and alternatives. Additionally, having a substrate structure with high thermal conductivity in combination with the electrostatic chucking may afford better deposition conditions for the subsequent formation of engineered layers and epitaxial layers, as well as for the subsequent device fabrication steps. For example, it may provide desirable thermal profiles that can result in lower stress, more uniform deposition thicknesses, and better stoichiometry control through the subsequent layer formations.

A second adhesion layer 1116 (e.g., a TEOS oxide layer on the order of 1,000 Å in thickness) is formed surrounding the conductive layer 1114. The second adhesion layer 1116 completely surrounds the conductive layer 1114 in some embodiments to form a fully encapsulated structure and can be formed using an LPCVD process, a CVD process, or any other suitable deposition process, including the deposition of a spin-on dielectric.

A barrier layer 1118, for example, a silicon nitride layer, is formed surrounding the second adhesion layer 1116. In an embodiment, the barrier layer 1118 is a silicon nitride layer that is on the order of 2,000 Å to 5,000 Å in thickness. The barrier layer 1118 completely surrounds the second adhesion layer 1116 in some embodiments to form a fully encapsulated structure and can be formed using an LPCVD process. In addition to silicon nitride layers, amorphous materials including SiCN, SiON, AlN, SiC, and the like can be utilized as barrier layers 1118. In some implementations, the barrier layer 1118 consists of a number of sub-layers that are built up to form the barrier layer 1118. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 1118, e.g., a silicon nitride layer, prevents diffusion and/or outgassing of elements present in the core, for example, yttrium (elemental), yttrium oxide (i.e., yttria), oxygen, metallic impurities, other trace elements, and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments, can be utilized in semiconductor process flows and clean room environments.

Typically, ceramic materials utilized to form the core are fired at temperatures in the range of 1,800° C. It would be expected that this process would drive out a significant amount of impurities present in the ceramic materials. These impurities can include yttrium, which results from the use of yttria as sintering agent, calcium, and other elements and compounds. Subsequently, during epitaxial growth processes, which are conducted at much lower temperatures in the range of 800° C. to 1,100° C., it would be expected that the subsequent diffusion of these impurities would be insignificant. However, contrary to conventional expectations, the inventors have determined that even during epitaxial growth processes at temperatures much less than the firing temperature of the ceramic materials, significant diffusion of elements through the layers of the engineered substrate was present. Thus, embodiments of the present invention integrate the barrier layer 1118 into the engineered substrate structure to prevent this undesirable diffusion.

Referring once again to FIG. 11, a bonding layer 1120 (e.g., a silicon oxide layer) is deposited on a portion of the barrier layer 1118, for example, the top surface of the barrier layer 1118, and subsequently used during the bonding of a substantially single crystal layer 1125 (e.g., a single crystal silicon layer such as the exfoliated silicon (111) layer illustrated in FIG. 11). The bonding layer 1120 can be approximately 1.5 μm in thickness in some embodiments. In some embodiments, the thickness of the bonding layer 1120 is 20 nm or more for bond-induced void mitigation. In some embodiments, the thickness of the bonding layer 1120 is in the range of 0.75-1.5 μm.

The substantially single crystal layer 1125 (e.g., exfoliated Si (111)) is suitable for use as a growth layer during an epitaxial growth process for the formation of epitaxial materials. In some embodiments, the epitaxial material can include a GaN layer 2 μm to 10 μm in thickness, which can be utilized as one of a plurality of layers utilized in optoelectronic, RF, and power devices. In an embodiment, the substantially single crystal layer 1125 includes a single crystal silicon layer that is attached to the bonding layer 1120 using a layer transfer process.

Additional description related to the engineered substrate structure is provided in U.S. patent application Ser. No. 15/621,335, filed on Jun. 13, 2017, and U.S. patent application Ser. No. 15/621,235, filed on Jun. 13, 2017, the disclosures of which are hereby incorporated by reference in their entirety for all purposes.

Figure 12:
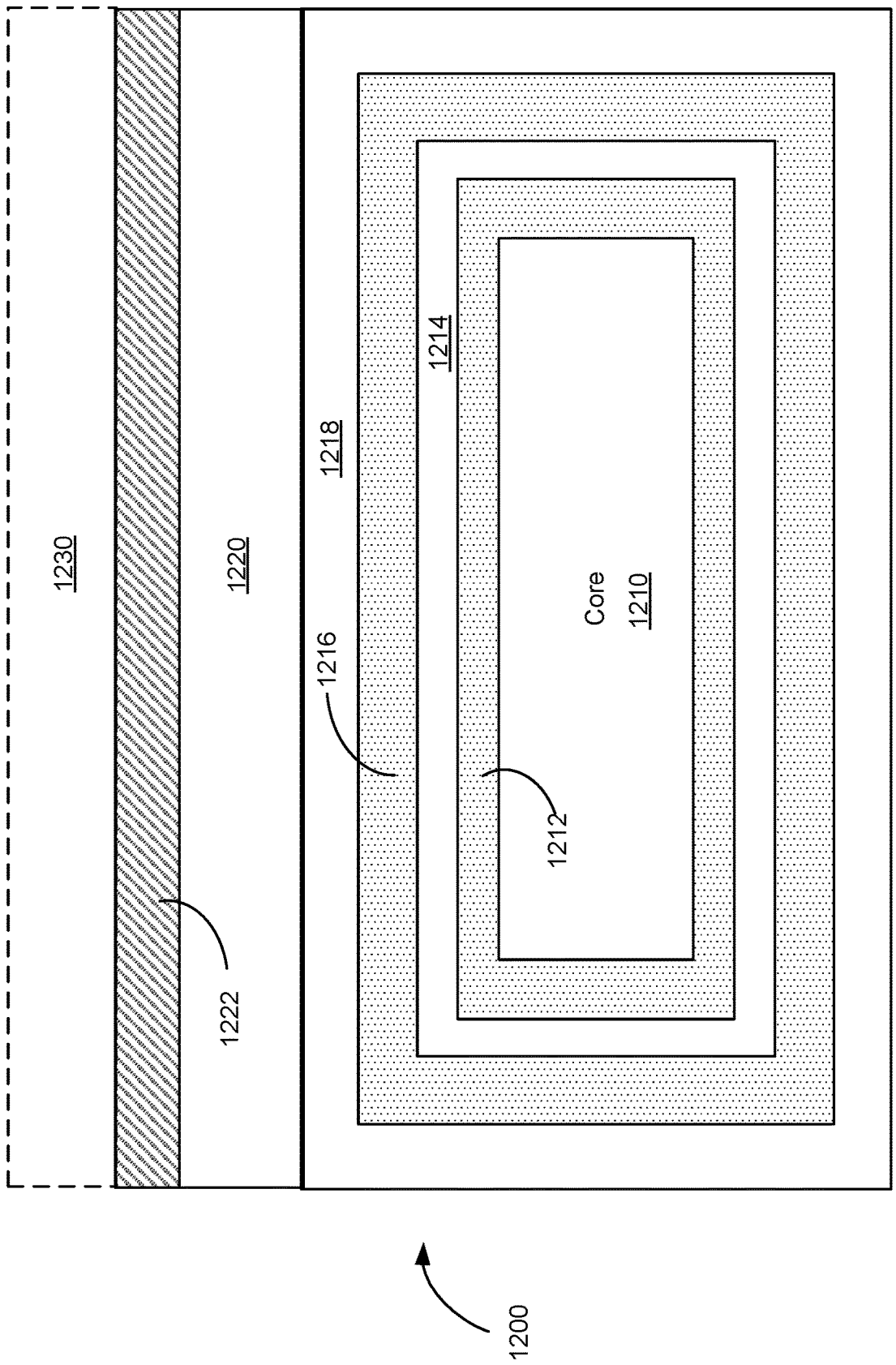
FIG. 12 is a simplified schematic diagram illustrating an engineered substrate structure according to some embodiments of the present invention.

FIG. 12 is a simplified schematic cross-sectional diagram illustrating an engineered substrate 1200 according to an embodiment of the present invention. The engineered substrate 900 illustrated in FIG. 12 is suitable for a variety of electronic and optical applications. The engineered substrate 1200 includes a core 1210 that can have a coefficient of thermal expansion (CTE) that is substantially matched to the CTE of the epitaxial material that will be grown on the engineered substrate 1200. Epitaxial material 1230 is illustrated as optional because it is not required as an element of the engineered substrate 1200, but will typically be grown on the engineered substrate 1200.

For applications including the growth of gallium nitride (GaN)-based materials (epitaxial layers including GaN-based layers), the core 1210 can be a polycrystalline ceramic material such as polycrystalline aluminum nitride (AlN), which can include a binding material such as yttrium oxide. Other materials can be utilized in the core 1210, including polycrystalline gallium nitride (GaN), polycrystalline aluminum gallium nitride (AlGaN), polycrystalline silicon carbide (SiC), polycrystalline zinc oxide (ZnO), polycrystalline gallium trioxide ($Ga_2O_3$), and the like.

The thickness of the core 1210 can be on the order of 100 μm to 1,500 μm, for example, 725 μm. The core 1210 is encapsulated in an adhesion layer 1212 that can be referred to as a shell or an encapsulating shell. In an embodiment, the adhesion layer 1212 comprises a tetraethyl orthosilicate (TEOS) oxide layer on the order of 1,000 Å in thickness. In other embodiments, the thickness of the adhesion layer varies, for example, from 100 Å to 2,000 Å. Although TEOS oxides are utilized for adhesion layers in some embodiments, other materials that provide for adhesion between later deposited layers and underlying layers or materials (e.g., ceramics, in particular, polycrystalline ceramics) can be utilized according to an embodiment of the present invention. For example, $SiO_2$ or other silicon oxides ($Si_xO_y$) adhere well to ceramic materials and provide a suitable surface for subsequent deposition, for example, of conductive materials. In some embodiments, the adhesion layer 1212 completely surrounds the core 1210 to form a fully encapsulated core. The adhesion layer 1212 can be formed using a low pressure chemical-vapor deposition (LPCVD) process. The adhesion layer 1212 provides a surface on which subsequent layers adhere to form elements of the engineered substrate 1200 structure.

In addition to the use of LPCVD processes, furnace-based processes, and the like to form the encapsulating first adhesion layer 1212, other semiconductor processes can be utilized according to embodiments of the present invention, including CVD processes or similar deposition processes. As an example, a deposition process that coats a portion of the core can be utilized, the core 1210 can be flipped over, and the deposition process could be repeated to coat additional portions of the core. Thus, although LPCVD techniques are utilized in some embodiments to provide a fully encapsulated structure, other film formation techniques can be utilized depending on the particular application.

A conductive layer 1214 is formed surrounding the adhesion layer 1212. In an embodiment, the conductive layer 1214 is a shell of polysilicon (i.e., polycrystalline silicon) that is formed surrounding the first adhesion layer 1212 since polysilicon can exhibit poor adhesion to ceramic materials. In embodiments in which the conductive layer 1214 is polysilicon, the thickness of the polysilicon layer can be on the order of 500-5,000 Å, for example, 2,500 Å. In some embodiments, the polysilicon layer can be formed as a shell to completely surround the first adhesion layer 1212 (e.g., a TEOS oxide layer), thereby forming a fully encapsulated first adhesion layer 1212, and can be formed using an LPCVD process. In other embodiments, as discussed below, the conductive material can be formed on a portion of the adhesion layer, for example, a lower half of the substrate structure. In some embodiments, conductive material can be formed as a fully encapsulating layer and subsequently removed on one side of the substrate structure.

In an embodiment, the conductive layer 1214 can be a polysilicon layer doped to provide a highly conductive material, for example, doped with boron to provide a P-type polysilicon layer. In some embodiments, the doping with boron is at a level of $1 \times 10^{19}$ cm$^{-3}$ to $1 \times 10^{20}$ cm$^{-3}$ to provide for high conductivity. Other dopants at different dopant concentrations (e.g., phosphorus, arsenic, bismuth, or the like at dopant concentrations ranging from $1 \times 10^{16}$ cm$^{-3}$ to $5 \times 10^{18}$ cm$^{-3}$) can be utilized to provide either N-type or P-type semiconductor materials suitable for use in the conductive layer 1214. One of ordinary skill in the art would recognize many variations, modifications, and alternatives.

The presence of the conductive layer 1214 is useful during electrostatic chucking of the engineered substrate 1200 to semiconductor processing tools, for example tools with electrostatic discharge chucks (ESC). The conductive layer 1214 enables rapid dechucking after processing in the semiconductor processing tools. Thus, embodiments of the present invention provide substrate structures that can be processed in manners utilized with conventional silicon wafers. One of ordinary skill in the art would recognize many variations, modifications, and alternatives.

A second adhesion layer 1216 (e.g., a TEOS oxide layer on the order of 1,000 Å in thickness) is formed surrounding the conductive layer 1214. In some embodiments, the second adhesion layer 1216 completely surrounds the conductive layer 1214 to form a fully encapsulated structure. The second adhesion layer 1216 can be formed using an LPCVD process, a CVD process, or any other suitable deposition process, including the deposition of a spin-on dielectric.

A barrier layer 1218, for example, a silicon nitride layer, is formed surrounding the second adhesion layer 1216. In an embodiment, the barrier layer 1218 is a silicon nitride layer that is on the order of 4,000 Å to 5,000 Å in thickness. The barrier layer 1218 completely surrounds the second adhesion layer 1216 in some embodiments to form a fully encapsulated structure and can be formed using an LPCVD process. In addition to silicon nitride layers, amorphous materials including SiCN, SiON, AlN, SiC, and the like can be utilized as barrier layers. In some implementations, the barrier layer consists of a number of sub-layers that are built up to form the barrier layer. Thus, the term barrier layer is not intended to denote a single layer or a single material, but to encompass one or more materials layered in a composite manner. One of ordinary skill in the art would recognize many variations, modifications, and alternatives.

In some embodiments, the barrier layer 1218, e.g., a silicon nitride layer, prevents diffusion and/or outgassing of elements present in the core 1210 into the environment of the semiconductor processing chambers in which the engineered substrate 1200 could be present, for example, during a high temperature (e.g., 1,000° C.) epitaxial growth process. Elements present in the core 1210 can include, for example, yttrium oxide (i.e., yttria), oxygen, metallic impurities, other trace elements, and the like. The elements diffused from the core 1210 can cause unintentional doping in engineered layers 1220/1222. The elements outgassed from the core 1210 can travel through the chamber and adsorb elsewhere on the wafer causing impurities in engineered layers 1220/1222 and epitaxial material 1230. Utilizing the encapsulating layers described herein, ceramic materials, including polycrystalline AlN that are designed for non-clean room environments, can be utilized in semiconductor process flows and clean room environments.

A bonding layer 1220 (e.g., a silicon oxide layer) is deposited on a portion of the barrier layer 1218, for example, the top surface of the barrier layer, and subsequently used during the bonding of a single crystal layer 1222. The bonding layer 1220 can be approximately 1.5 μm in thickness in some embodiments. The single crystal layer 1222 can include, for example, Si, SiC, sapphire, GaN, AlN, SiGe, Ge, Diamond, Ga$_2$O$_3$, AlGaN, InGaN, InN, and/or ZnO. In some embodiments, the single crystal layer 1222 can have a thickness from 0-0.5 μm. The single crystal layer 1222 is suitable for use as a growth layer during an epitaxial growth process for the formation of epitaxial material 1230. The crystalline layers of the epitaxial material 1230 are an extension of the underlying semiconductor lattice associated with the single crystal layer 1222. The unique CTE matching properties of the engineered substrate 1200 enable growth of thicker epitaxial material 1230 than existing technologies. In some embodiments, the epitaxial material 1230 includes a gallium nitride layer, 2 μm to 10 μm in thickness, which can be utilized as one of a plurality of layers utilized in optoelectronic devices, power devices, and the like. In other embodiments, the epitaxial material 1130 is greater than 10 μm in thickness and can be an epitaxial structure including a plurality of epitaxial layers. In an embodiment, the bonding layer 1220 includes a single crystal silicon layer that is attached to a silicon oxide barrier layer 1218 using a layer transfer process.

Figure 13:
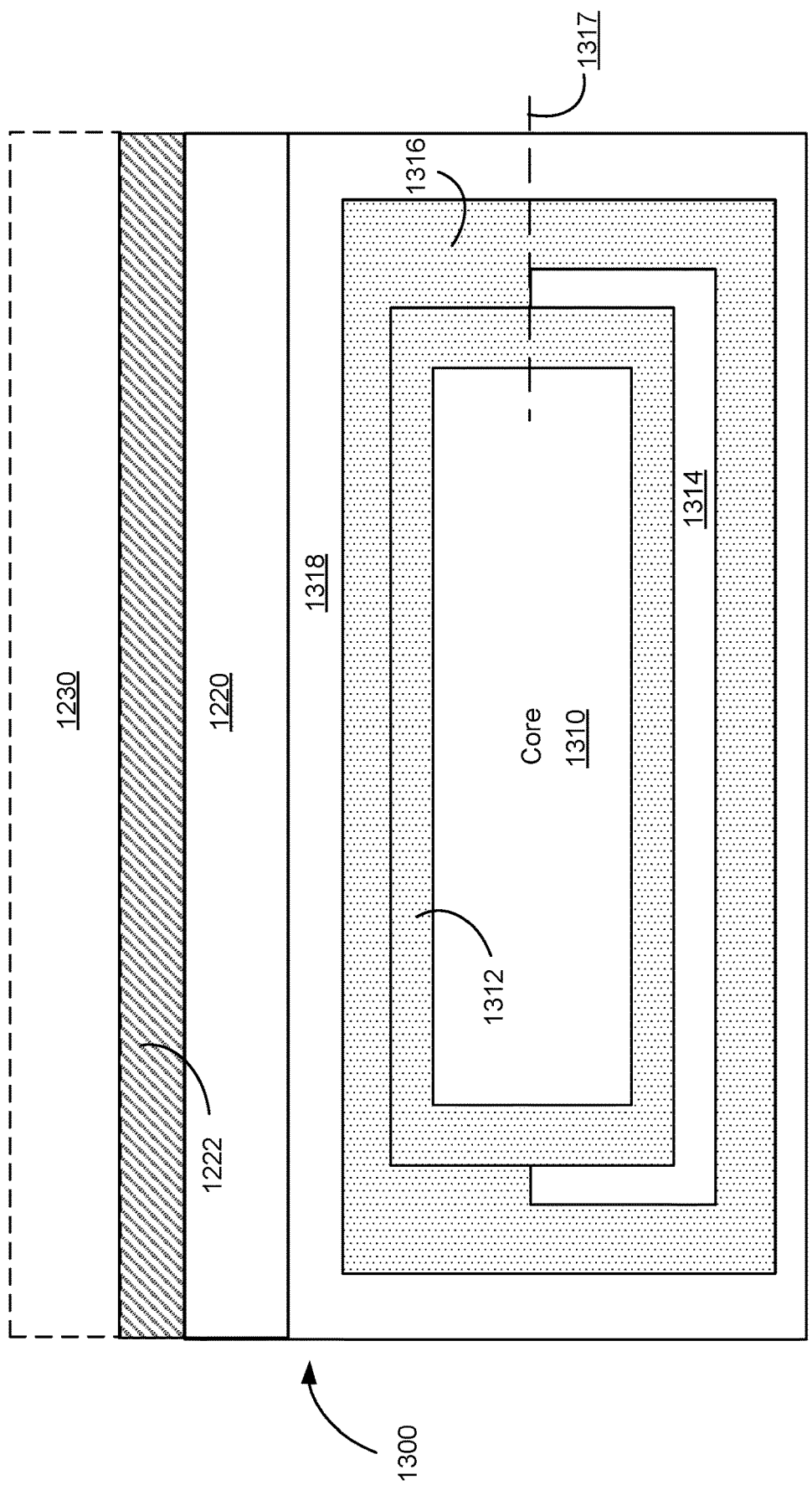
FIG. 13 is a simplified schematic diagram illustrating an engineered substrate structure according to some other embodiments of the present invention.

FIG. 13 is a simplified schematic diagram illustrating an engineered substrate structure according to an embodiment of the present invention. The engineered substrate 1300 illustrated in FIG. 13 is suitable for a variety of electronic and optical applications. The engineered substrate includes a core 1310 that can have a coefficient of thermal expansion (CTE) that is substantially matched to the CTE of the epitaxial material 1230 that will be grown on the engineered substrate 1300. The epitaxial material 1230 is illustrated as optional because it is not required as an element of the engineered substrate structure, but will typically be grown on the engineered substrate structure.

For applications including the growth of gallium nitride (GaN)-based materials (epitaxial layers including GaN-based layers), the core 1310 can be a polycrystalline ceramic material, for example, polycrystalline aluminum nitride (AlN). The thickness of the core 1010 can be on the order of 100 to 1,500 µm, for example, 725 µm. The core 1310 is encapsulated in a first adhesion layer 1312 that can be referred to as a shell or an encapsulating shell. In this implementation, the first adhesion layer 1312 completely encapsulates the core, but this is not required by the present invention, as discussed in additional detail with respect to FIG. 14.

In an embodiment, the first adhesion layer 1312 comprises a tetraethyl orthosilicate (TEOS) layer on the order of 1,000 Å in thickness. In other embodiments, the thickness of the first adhesion layer 1312 varies, for example, from 100 Å to 2,000 Å. Although TEOS is utilized for adhesion layers in some embodiments, other materials that provide for adhesion between later deposited layers and underlying layers or materials can be utilized according to an embodiment of the present invention. For example, $SiO_2$, SiON, and the like adhere well to ceramic materials and provide a suitable surface for subsequent deposition, for example, of conductive materials. The first adhesion layer 1312 completely surrounds the core 1310 in some embodiments to form a fully encapsulated core and can be formed using an LPCVD process. The adhesion layer 1312 provides a surface on which subsequent layers adhere to form elements of the engineered substrate structure.

In addition to the use of LPCVD processes, furnace-based processes, and the like to form the encapsulating adhesion layer 1312, other semiconductor processes can be utilized according to embodiments of the present invention. As an example, a deposition process, for example, CVD, PECVD, or the like, that coats a portion of the core 1310 can be utilized, the core 1310 can be flipped over, and the deposition process could be repeated to coat additional portions of the core.

A conductive layer 1314 is formed on at least a portion of the first adhesion layer 1312. In an embodiment, the conductive layer 1314 includes polysilicon (i.e., polycrystalline silicon) that is formed by a deposition process on a lower portion (e.g., the lower half or backside) of the core/adhesion layer structure. In embodiments in which the conductive layer 1314 is polysilicon, the thickness of the polysilicon layer can be on the order of a few thousand angstroms, for example, 3,000 Å. In some embodiments, the polysilicon layer can be formed using an LPCVD process.

In an embodiment, the conductive layer 1314 can be a polysilicon layer doped to provide a highly conductive material, for example, the conductive layer 1314 can be doped with boron to provide a p-type polysilicon layer. In some embodiments, the doping with boron is at a level ranging from about $1 \times 10^{19}$ cm$^{-3}$ to $1 \times 10^{20}$ cm$^{-3}$ to provide for high conductivity. The presence of the conductive layer 1314 is useful during electrostatic chucking of the engineered substrate to semiconductor processing tools, for example tools with electrostatic chucks (ESC). The conductive layer 1314 enables rapid dechucking after processing. Thus, embodiments of the present invention provide substrate structures that can be processed in manners utilized with conventional silicon wafers. One of ordinary skill in the art would recognize many variations, modifications, and alternatives.

A second adhesion layer 1316 (e.g., a second TEOS layer) is formed surrounding the conductive layer 1314 (e.g., a polysilicon layer). The second adhesion layer 1316 is on the order of 1,000 Å in thickness. The second adhesion layer 1316 can completely surround the conductive layer 1314 as well as the first adhesion layer 1312 in some embodiments to form a fully encapsulated structure and can be formed using an LPCVD process. In other embodiments, the second adhesion layer 1316 only partially surrounds the conductive layer 1314, for example, terminating at the position illustrated by plane 1317, which may be aligned with the top surface of the conductive layer 1314. In this example, the top surface of the conductive layer 1314 will be in contact with a portion of barrier layer 1318. One of ordinary skill in the art would recognize many variations, modifications, and alternatives.

A barrier layer 1318 (e.g., a silicon nitride layer) is formed surrounding the second adhesion layer 1316. The barrier layer 1318 is on the order of 4,000 Å to 5,000 Å in thickness in some embodiments. In some embodiments, the barrier layer 1318 completely surrounds the second adhesion layer 1316 to form a fully encapsulated structure and can be formed using an LPCVD process.

In some embodiments, the use of a silicon nitride barrier layer prevents diffusion and/or outgassing of elements present in the core 1310, for example, yttrium oxide (i.e., yttria), oxygen, metallic impurities, other trace elements and the like into the environment of the semiconductor processing chambers in which the engineered substrate could be present, for example, during a high temperature (e.g., 1,000° C.) epitaxial growth process. Utilizing the encapsulating layers described herein, ceramic materials, including polycrystalline AlN that are designed for non-clean room environments can be utilized in semiconductor process flows and clean room environments.

Figure 14:
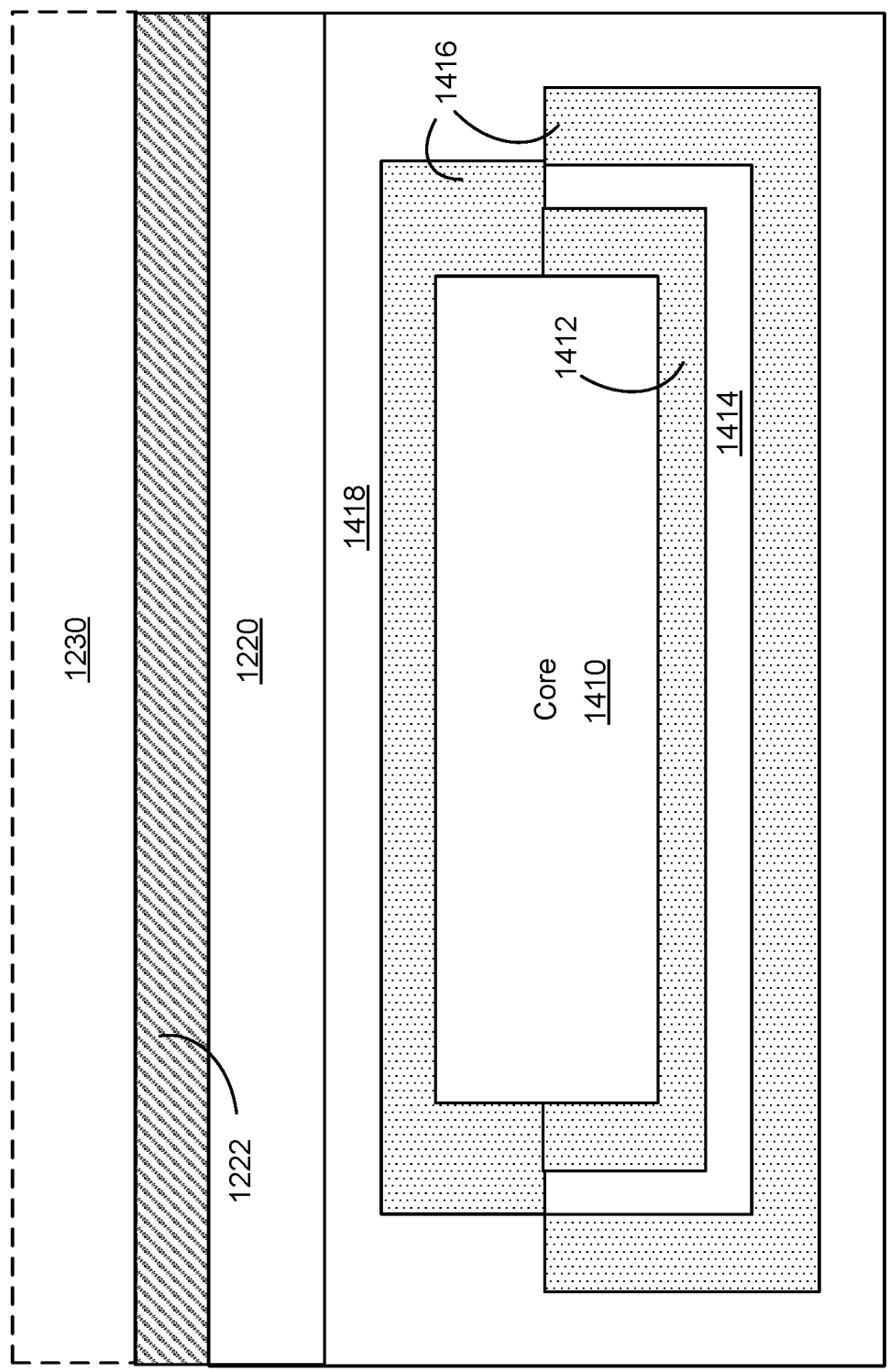
FIG. 14 is a simplified schematic diagram illustrating an engineered substrate structure according to some further embodiments of the present invention.

FIG. 14 is a simplified schematic diagram illustrating an engineered substrate structure according to another embodiment of the present invention. In the embodiment illustrated in FIG. 14, a first adhesion layer 1412 is formed on at least a portion of the core 1410, but does not encapsulate the core 1410. In this implementation, the first adhesion layer 1412 is formed on a lower surface of the core 1410 (the backside of the core 1410) in order to enhance the adhesion of a subsequently formed conductive layer 1414 as described more fully below. Although adhesion layer 1412 is only illustrated on the lower surface of the core 1410 in FIG. 14, it will be appreciated that deposition of adhesion layer material on other portions of the core 1410 will not adversely impact the performance of the engineered substrates structure and such material can be present in various embodiments. One of ordinary skill in the art would recognize many variations, modifications, and alternatives.

The conductive layer 1414 does not encapsulate the first adhesion layer 1412 and the core 1410, but is substantially aligned with the first adhesion layer 1412. Although the conductive layer 1414 is illustrated as extending along the bottom or backside and up a portion of the sides of the first adhesion layer 1412, extension along the vertical side is not required by the present invention. Thus, embodiments can utilize deposition on one side of the substrate structure, masking of one side of the substrate structure, or the like. The conductive layer 1414 can be formed on a portion of one side, for example, the bottom/backside, of the first adhesion layer 1412. The conductive 1414 layer provides for electrical conduction on one side of the engineered substrate structure, which can be advantageous in RF and high power applications. The conductive layer 1414 can include doped polysilicon as discussed in relation to the conductive layer 1314 in FIG. 13.

A portion of the core 1410, portions of the first adhesion layer 1412, and the conductive layer 1414 are covered with a second adhesion layer 1416 in order to enhance the adhesion of the barrier layer 1418 to the underlying materials. The barrier layer 1418 forms an encapsulating structure to prevent diffusion from underlying layers as discussed above.

In addition to semiconductor-based conductive layers, in other embodiments, the conductive layer 1414 is a metallic layer, for example, 500 Å of titanium, or the like.

Referring once again to FIG. 14, depending on the implementation, one or more layers may be removed. For example, layers 1412 and 1414 can be removed, only leaving a single adhesion shell 1416 and the barrier layer 1418. In another embodiment, only layer 1414 can be removed. In this embodiment, layer 1412 may also balance the stress and the wafer bow induced by layer 1220, deposited on top of layer 1418. The construction of a substrate structure with insulating layers on the top side of Core 1410 (e.g., with only insulating layer between core 1410 and layer 1220) will provide benefits for power/RF applications, where a highly insulating substrate is desirable.

In another embodiment, the barrier layer 1418 may directly encapsulate core 1410, followed by the conductive layer 1414 and subsequent adhesion layer 1416. In this embodiment, layer 1220 may be directly deposited onto the adhesion layer 1416 from the top side. In yet another embodiment, the adhesion layer 1416 may be deposited on the core 1410, followed by a barrier layer 1418, and then followed by a conductive layer 1414, and another adhesion layer 1412.

Figure 15:
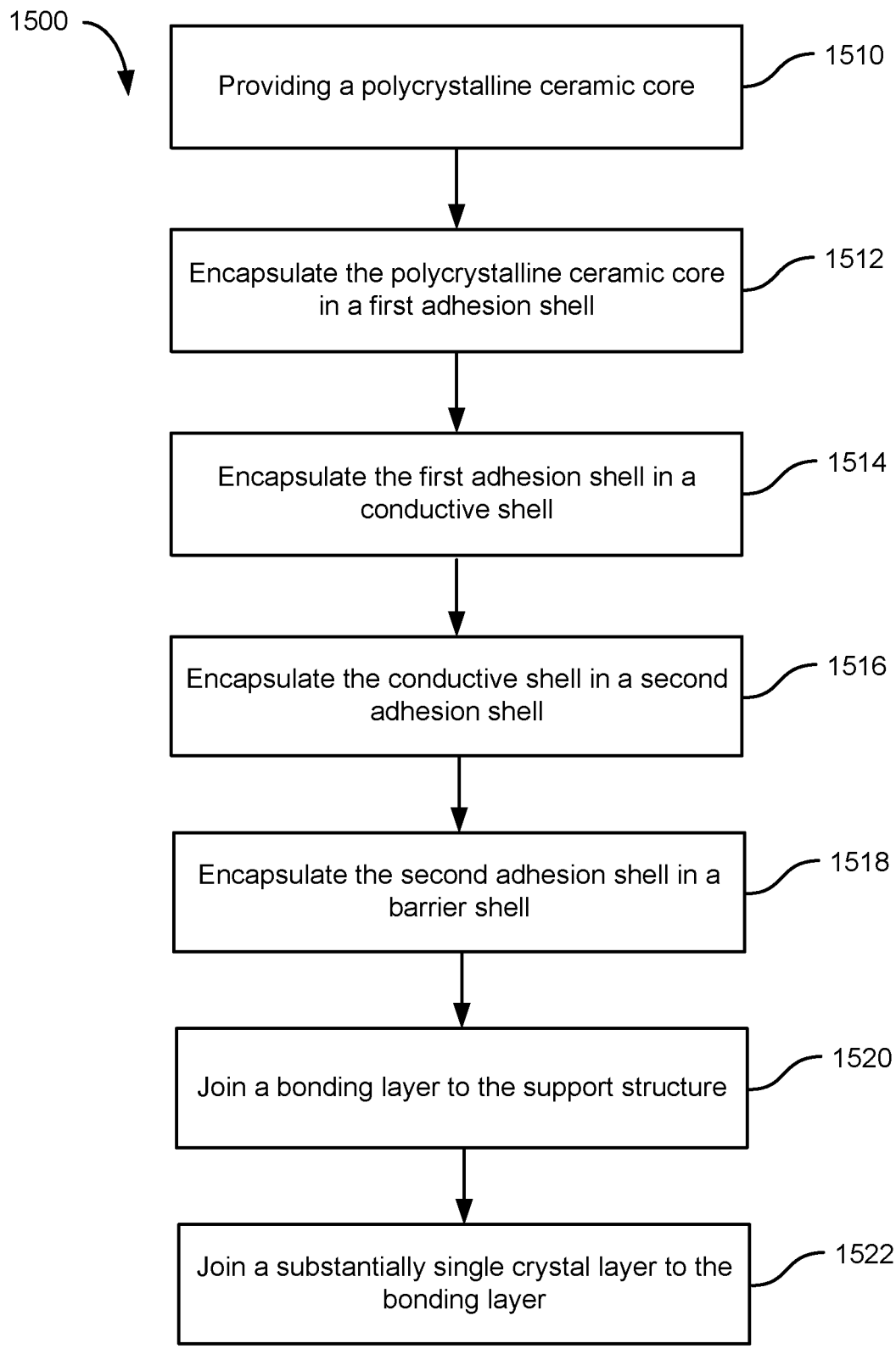
FIG. 15 is a simplified flowchart illustrating a method of fabricating an engineered substrate according to some embodiments of the present invention.

FIG. 15 is a simplified flowchart illustrating a method 1500 of fabricating an engineered substrate according to an embodiment of the present invention. The method 1500 can be utilized to manufacture a substrate that is CTE matched to one or more of the epitaxial layers grown on the substrate. The method 1500 includes forming a support structure by providing a polycrystalline ceramic core (1510), encapsulating the polycrystalline ceramic core in a first adhesion layer forming a shell (1512) (e.g., a tetraethyl orthosilicate (TEOS) oxide shell), and encapsulating the first adhesion layer in a conductive shell (1514) (e.g., a polysilicon shell). The first adhesion layer can be formed as a single layer of TEOS oxide. The conductive shell can be formed as a single layer of polysilicon.

The method 1500 also includes encapsulating the conductive shell in a second adhesion layer (1516) (e.g., a second TEOS oxide shell) and encapsulating the second adhesion layer in a barrier layer shell (1518). The second adhesion layer can be formed as a single layer of TEOS oxide. The barrier layer shell can be formed as a single layer of silicon nitride.

Once the support structure is formed by processes 1510-1518, the method 1500 further includes joining a bonding layer (e.g., a silicon oxide layer) to the support structure (1520) and joining a substantially single crystal layer, for example, a single crystal silicon layer, to the silicon oxide layer (1522). Other substantially single crystal layers can be used according to embodiments of the present invention, including SiC, sapphire, GaN, AlN, SiGe, Ge, Diamond, $Ga_2O_3$, ZnO, and the like. The joining of the bonding layer can include deposition of a bonding material followed by planarization processes as described herein. In an embodiment as described below, joining the substantially single crystal layer (e.g., a single crystal silicon layer) to the bonding layer utilizes a layer transfer process in which the layer is a single crystal silicon layer that is transferred from a silicon wafer.

Referring to FIG. 12, the bonding layer 1220 can be formed by a deposition of a thick (e.g., 4 µm thick) oxide layer followed by a chemical mechanical polishing (CMP) process to thin the oxide to approximately 1.5 µm in thickness. The thick initial oxide serves to fill voids and surface features present on the support structure that may be present after fabrication of the polycrystalline core and continue to be present as the encapsulating layers illustrated in FIG. 12 are formed. The oxide layer also serves as a dielectric layer for the devices. The CMP process provides a substantially planar surface free of voids, particles, or other features, which can then be used during a wafer transfer process to bond the single crystal layer 1222 (e.g., a single crystal silicon layer) to the bonding layer 1220. It will be appreciated that the bonding layer does not have to be characterized by an atomically flat surface, but should provide a substantially planar surface that will support bonding of the single crystal layer (e.g., a single crystal silicon layer) with the desired reliability.

A layer transfer process is used to join the single crystal layer 1222 (e.g., a single crystal silicon layer) to the bonding layer 1220. In some embodiments, a silicon wafer including the substantially single crystal layer 1222 (e.g., a single crystal silicon layer) is implanted to form a cleavage plane. In this embodiment, after wafer bonding, the silicon substrate can be removed along with the portion of the single crystal silicon layer below the cleavage plane, resulting in an exfoliated single crystal silicon layer. The thickness of the single crystal layer 1222 can be varied to meet the specifications of various applications. Moreover, the crystal orientation of the single crystal layer 1222 can be varied to meet the specifications of the application. Additionally, the doping levels and profile in the single crystal layer can be varied to meet the specifications of the particular application. In some embodiments, the depth of the implant may be adjusted to be greater than the desired final thickness of single crystal layer 1222. The additional thickness allows for the removal of the thin portion of the transferred substantially single crystal layer that is damaged, leaving behind the undamaged portion of the desired final thickness. In some embodiments, the surface roughness can be modified for high quality epitaxial growth. One of ordinary skill in the art would recognize many variations, modifications, and alternatives.

In some embodiments, the single crystal layer 1222 can be thick enough to provide a high quality lattice template for the subsequent growth of one or more epitaxial layers but thin enough to be highly compliant. The single crystal layer 1222 may be said to be "compliant" when the single crystal layer 1222 is relatively thin such that its physical properties are less constrained and able to mimic those of the materials surrounding it with less propensity to generate crystalline defects. The compliance of the single crystal layer 1222 may be inversely related to the thickness of the single crystal layer 1222. A higher compliance can result in lower defect densities in the epitaxial layers grown on the template and enable thicker epitaxial layer growth. In some embodiments, the thickness of the single crystal layer 1222 may be increased by epitaxial growth of silicon on the exfoliated silicon layer.

In some embodiments, adjusting the final thickness of the single crystal layer 1222 may be achieved through thermal oxidation of a top portion of an exfoliated silicon layer, followed by an oxide layer strip with hydrogen fluoride (HF) acid. For example, an exfoliated silicon layer having an initial thickness of 0.5 µm may be thermally oxidized to create a silicon dioxide layer that is about 420 nm thick. After removal of the grown thermal oxide, the remaining silicon thickness in the transferred layer may be about 53 nm. During thermal oxidation, implanted hydrogen may migrate toward the surface. Thus, the subsequent oxide layer strip may remove some damage. Also, thermal oxidation is typically performed at a temperature of 1000° C. or higher. The elevated temperature can may also repair lattice damage.

The silicon oxide layer formed on the top portion of the single crystal layer during thermal oxidation can be stripped using HF acid etching. The etching selectivity between silicon oxide and silicon ($SiO_2$:Si) by HF acid may be adjusted by adjusting the temperature and concentration of the HF solution and the stoichiometry and density of the silicon oxide. Etch selectivity refers to the etch rate of one material relative to another. The selectivity of the HF solution can range from about 10:1 to about 100:1 for (SiO2:Si). A high etch selectivity may reduce the surface roughness by a similar factor from the initial surface roughness. However, the surface roughness of the resultant single crystal layer 1222 may still be larger than desired. For example, a bulk Si (111) surface may have a root-mean-square (RMS) surface roughness of less than 0.1 nm as determined by a 2 μm×2 μm atomic force microscope (AFM) scan before additional processing. In some embodiments, the desired surface roughness for epitaxial growth of gallium nitride materials on Si (111) may be, for example, less than 1 nm, less than 0.5 nm, or less than 0.2 nm, on a 30 μm×30 μm AFM scan area.

If the surface roughness of the single crystal layer 1222 after thermal oxidation and oxide layer strip exceeds the desired surface roughness, additional surface smoothing may be performed. There are several methods of smoothing a silicon surface. These methods may include hydrogen annealing, laser trimming, plasma smoothing, and touch polish (e.g., CMP). These methods may involve preferential attack of high aspect ratio surface peaks. Hence, high aspect ratio features on the surface may be removed more quickly than low aspect ratio features, thus resulting in a smoother surface.

It should be appreciated that the specific steps illustrated in FIG. 15 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 16:
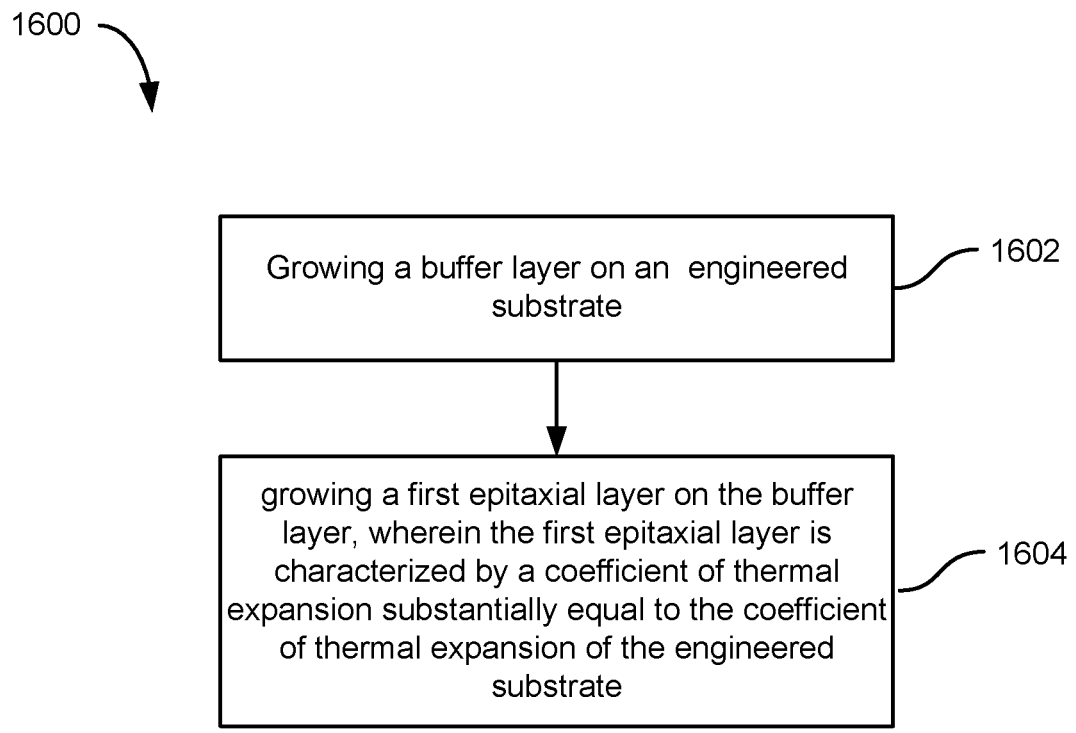
FIG. 16 is a simplified flowchart illustrating a method for making a multilayered device on an engineered substrate according to some embodiments of the present invention.

FIG. 16 is a simplified flowchart illustrating a method 1600 for making a multilayered device on an engineered substrate according to some embodiments of the present invention. The engineered substrate has a substrate coefficient of thermal expansion. Referring to FIGS. 1 and 2, the engineered substrate 102 may include a ceramic substrate 110, with a thin silicon (Si) layer 120 or a thin silicon germanium (SiGe) layer 220 formed thereon.

Referring to FIGS. 1, 2, and 16, the method 1600 may include growing a buffer layer 130 on the engineered substrate 102 (1602), and growing a first epitaxial layer 142 coupled to the buffer layer 130 (1604). The first epitaxial layer 142 may be characterized by an epitaxial coefficient of thermal expansion that is substantially equal to the substrate coefficient of thermal expansion. In some embodiments, the first epitaxial layer 142 may include doped gallium nitride (GaN). Referring to FIG. 6, in some other embodiments, the first epitaxial layer 142 may include aluminum gallium nitride (AlGaN).

The method 1600 may further include growing a second epitaxial layer 144 comprising undoped GaN coupled to the first epitaxial layer 142, and growing a third epitaxial layer 160 coupled to the second epitaxial layer 144. An interface between the second epitaxial layer 144 and the third epitaxial layer 160 may form a conducting channel 150 of a high-electron-mobility transistor (HEMT). In some embodiments, the third epitaxial layer 160 may include aluminum gallium nitride (AlGaN) or indium aluminum nitride (InAlN).

Referring to FIG. 3, in some embodiments, the method 1600 may further include forming an electrical contact 310 electrically coupled to the substantially single crystalline layer 120 through the engineered substrate 102. Referring to FIG. 4, in some other embodiments, the method 1600 may further include growing a conducting epitaxial layer 420 disposed between the buffer layer 130 and the first epitaxial layer 142, and forming an electrical contact 410 electrically coupled to the conducting epitaxial layer 420 through the first epitaxial layer 142. Referring to FIG. 5, in some embodiments, the method 1600 may further include forming a partial monolayer of silicon nitride ($Si_3N_4$) 510 disposed between the buffer layer 130 and the conducting epitaxial layer 420.

It should be appreciated that the specific steps illustrated in FIG. 16 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 17:
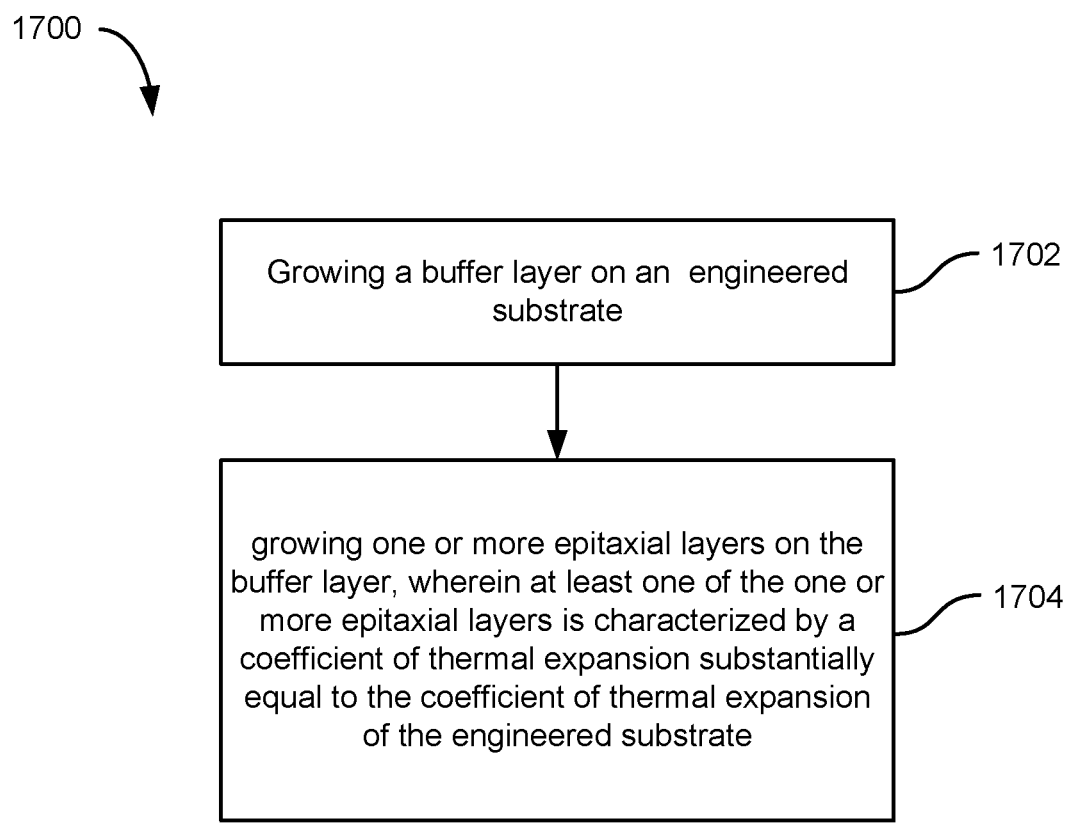
FIG. 17 is a simplified flowchart illustrating a method for making a multilayered device on an engineered substrate according to some other embodiments of the present invention.

FIG. 17 is a simplified flowchart illustrating a method 1700 for making a multilayered device on an engineered substrate according to some other embodiments of the present invention. The engineered substrate has a substrate coefficient of thermal expansion. Referring to FIG. 7, the engineered substrate 102 may include a ceramic substrate 110 with a thin silicon (Si) layer 120 formed thereon.

Referring to FIGS. 7 and 17, the method 1700 may include forming a buffer layer 130 on the engineered substrate 102 (1702), and growing one or more epitaxial layers 740 on the buffer layer 130 (1704). At least one of the one or more epitaxial layers 740 is characterized by an epitaxial coefficient of thermal expansion substantially equal to the substrate coefficient of thermal expansion. In some embodiments, the one or more epitaxial layers 740 may include a superlattice of alternating layers of undoped GaN and doped GaN. The doped GaN may include carbon-doped GaN (C—GaN) or iron-doped GaN (Fe—GaN). The buffer layer 130 may include at least one of AlN, AlGaN, or AlN/AlGaN.

The method 1700 may further include growing an undoped GaN layer 144 coupled to the one or more epitaxial layers 740, and growing a first epitaxial layer 160 comprising aluminum gallium nitride (AlGaN) or indium aluminum nitride (InAlN) coupled to the undoped GaN layer 144. An interface between the undooped GaN layer 144 and the first epitaxial layer 160 may form a conducting channel 150 of a high-electron-mobility transistor (HEMT).

It should be appreciated that the specific steps illustrated in FIG. 17 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 17 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
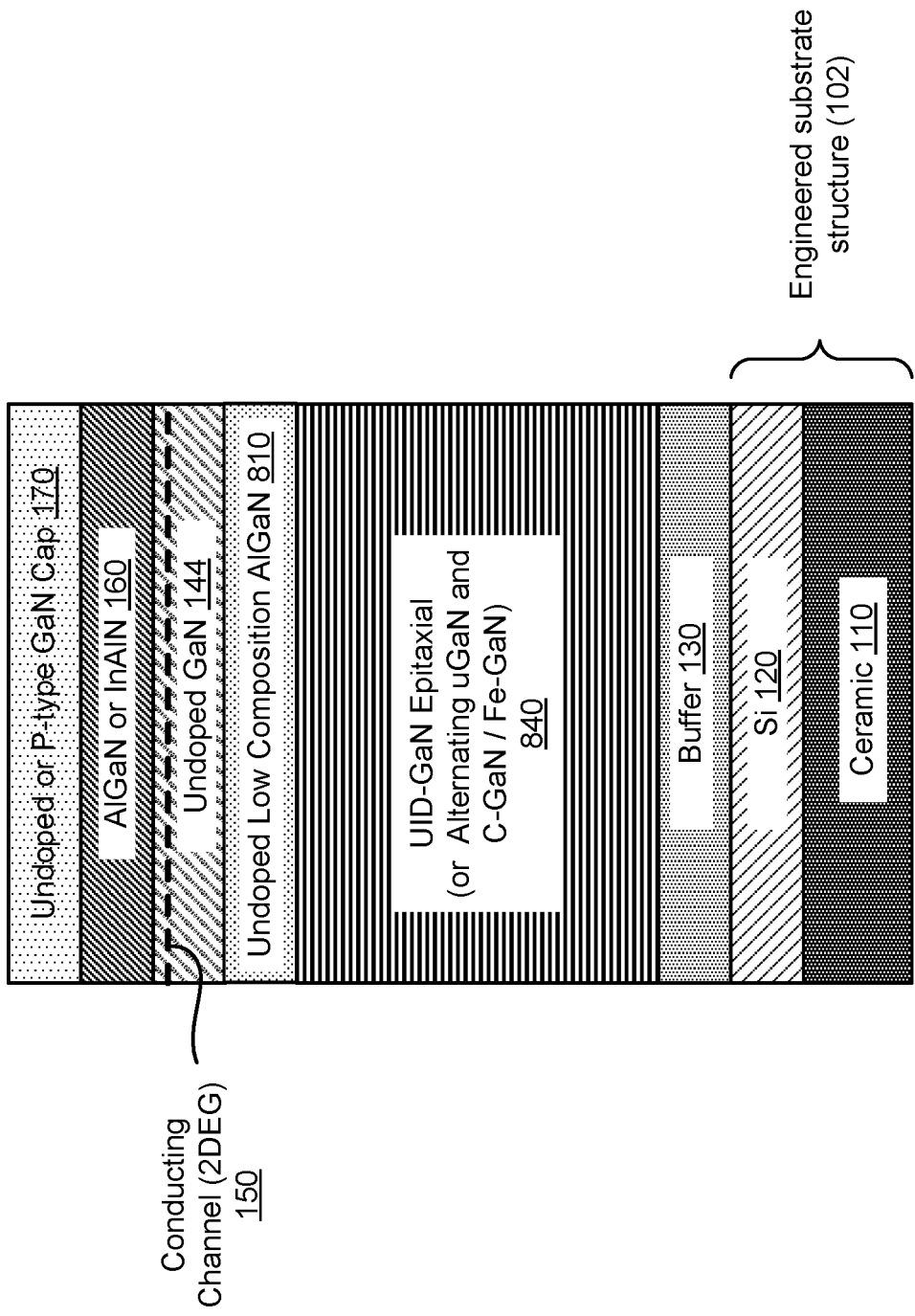
FIG. 8 is a simplified schematic cross-sectional diagram illustrating a power device formed on an engineered substrate structure according to some other embodiments of the present invention.
Figure 18:
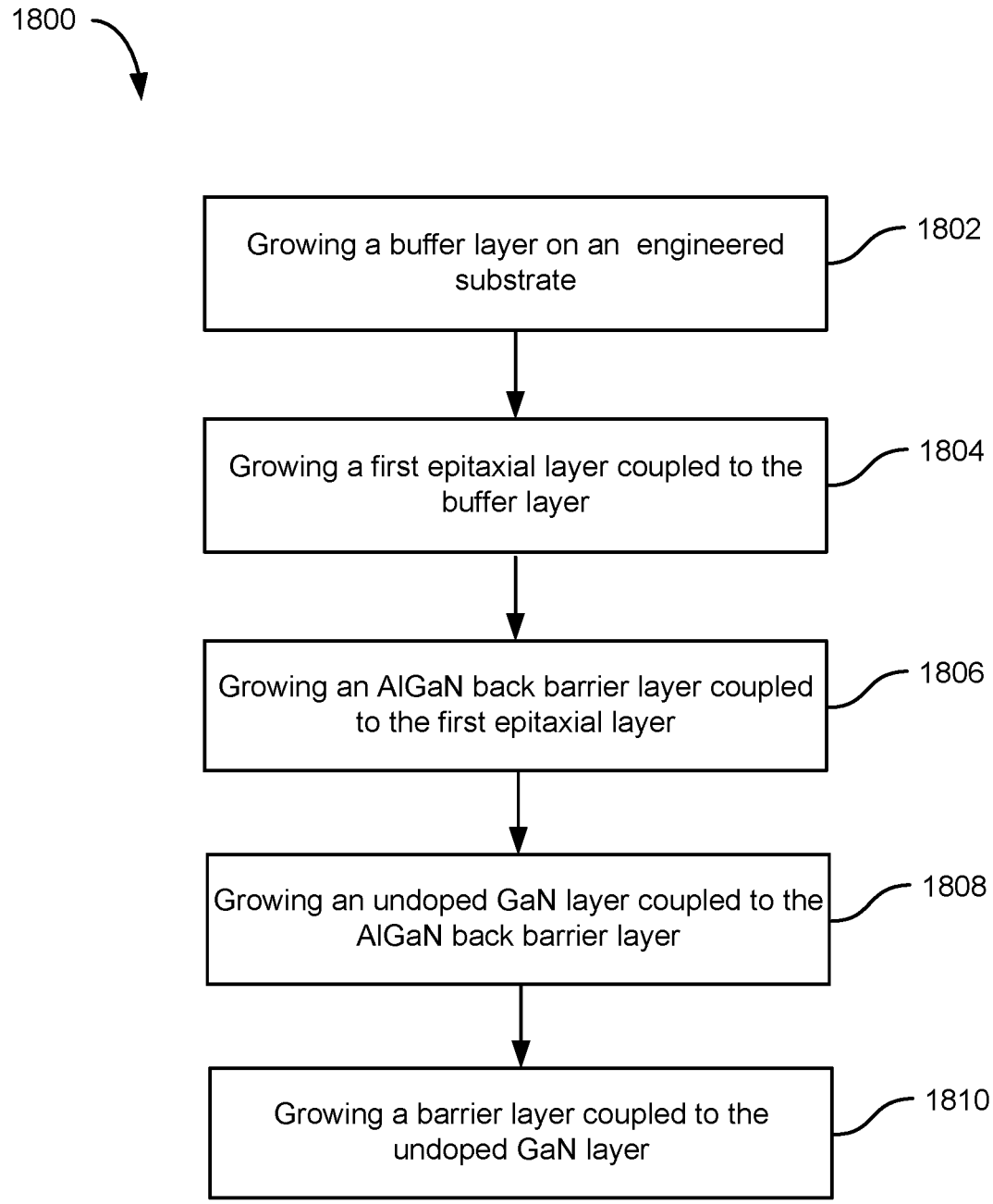
FIG. 18 is a simplified flowchart illustrating a method for making a multilayered device on an engineered substrate according to some further embodiments of the present invention.

FIG. 18 is a simplified flowchart illustrating a method 1800 for making a multilayered device on an engineered substrate according to some further embodiments of the present invention. The engineered substrate has a substrate coefficient of thermal expansion. Referring to FIG. 8, the engineered substrate 102 may include a ceramic substrate 110 with a thin silicon (Si) layer 120 formed thereon.

Referring to FIGS. 8 and 18, the method 1800 may include forming a buffer layer 130 on the engineered substrate 102 (1802), and growing a first epitaxial layer 840 coupled to the buffer layer 130 (1804). The first epitaxial layer 840 may be characterized by an epitaxial coefficient of thermal expansion that is substantially equal to the substrate coefficient of thermal expansion. In some embodiments, the first epitaxial layer 840 may include unintentionally doped GaN (uGaN). In some other embodiments, the first epitaxial layer 840 may include alternating layers of undoped GaN and doped GaN. In some embodiments, the doped GaN may include carbon-doped GaN (C—GaN) or iron-doped GaN (Fe—GaN).

The method 1800 may further include growing an aluminum gallium nitride (AlGaN) back barrier layer 810 coupled to the first epitaxial layer 840 (1806), growing an undoped gallium nitride (GaN) layer 144 coupled to the AlGaN back barrier layer 810 (1808), and growing a barrier layer 160 coupled to the undoped GaN layer 144 (1810). In some embodiments, the AlGaN back barrier layer 810 has an aluminum mole fraction ranging from about 3% to about 15%. The barrier layer 160 may include AlGaN or InGaN according to some embodiments.

It should be appreciated that the specific steps illustrated in FIG. 18 provide a particular method of fabricating an engineered substrate according to an embodiment of the present invention. Other sequences of steps may also be performed according to alternative embodiments. For example, alternative embodiments of the present invention may perform the steps outlined above in a different order. Moreover, the individual steps illustrated in FIG. 18 may include multiple sub-steps that may be performed in various sequences as appropriate to the individual step. Furthermore, additional steps may be added or removed depending on the particular applications. One of ordinary skill in the art would recognize many variations, modifications, and alternatives.

Although some embodiments have been discussed in terms of a layer, the term layer should be understood such that a layer can include a number of sub-layers that are built up to form the layer of interest. Thus, the term layer is not intended to denote a single layer consisting of a single material, but to encompass one or more materials layered in a composite manner to form the desired structure. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An epitaxial semiconductor structure comprising:
   an engineered substrate having a substrate coefficient of thermal expansion, the engineered substrate comprising:
      a polycrystalline ceramic core;
      a barrier layer encapsulating the polycrystalline ceramic core;
      a bonding layer coupled to the barrier layer; and
      a single crystalline silicon layer coupled to the bonding layer;
   a buffer layer coupled to the single crystalline silicon layer;
   a silicon nitride partial layer coupled to the buffer layer; and
   an epitaxial layer formed on the silicon nitride partial layer, wherein the epitaxial layer is characterized by an epitaxial coefficient of thermal expansion substantially equal to the substrate coefficient of thermal expansion.

2. The epitaxial semiconductor structure of claim 1 wherein the silicon nitride partial layer comprises a partial monolayer of silicon nitride.

3. The epitaxial semiconductor structure of claim 1 wherein the epitaxial layer comprises gallium nitride (GaN).

4. The epitaxial semiconductor structure of claim 3 further comprising one or more doped GaN layers coupled to the epitaxial layer.

5. The epitaxial semiconductor structure of claim 4 wherein a doping density for one or more of the one or more doped GaN layers ranges from $1\times10^{15}$ to $5\times10^{19}$ cm$^{-3}$.

6. The epitaxial semiconductor structure of claim 4 wherein a doping density for the one or more doped GaN layers is associated with intentional doping.

7. The epitaxial semiconductor structure of claim 4 wherein the one or more doped GaN layers comprise an n-type GaN layer.

8. The epitaxial semiconductor structure of claim 7 wherein the n-type GaN layer comprises silicon.

9. The epitaxial semiconductor structure of claim 4 wherein the one or more doped GaN layers comprise a p-type GaN layer.

10. The epitaxial semiconductor structure of claim 9 wherein the p-type GaN layer comprises magnesium.

11. The epitaxial semiconductor structure of claim 4 further comprising at least one undoped GaN layer coupled to the epitaxial layer.

12. The epitaxial semiconductor structure of claim 11 wherein a dopant density of the at least one undoped GaN layer is on the order of $1\times10^{16}$ cm$^{-3}$.

13. The epitaxial semiconductor structure of claim 11 wherein a dopant density of the at least one undoped GaN layer is less than $1\times10^{16}$ cm$^{-3}$.

14. The epitaxial semiconductor structure of claim 3 further comprising an additional silicon nitride partial layer coupled to the epitaxial layer.

15. The epitaxial semiconductor structure of claim 3 wherein the silicon nitride partial layer comprises multiple silicon nitride partial monolayers.

16. An epitaxial semiconductor structure comprising:
   an engineered substrate characterized by a substrate coefficient of thermal expansion and comprising:
      a polycrystalline ceramic core;

a barrier layer encapsulating the polycrystalline ceramic core;
a bonding layer coupled to the barrier layer; and
a single crystalline silicon layer coupled to the bonding layer;
a buffer layer coupled to the single crystalline silicon layer;
a silicon nitride partial layer coupled to the buffer layer; and
a gallium nitride (GaN) epitaxial layer formed on the silicon nitride partial layer, wherein the GaN epitaxial layer is characterized by an epitaxial coefficient of thermal expansion substantially equal to the substrate coefficient of thermal expansion.

17. The epitaxial semiconductor structure of claim 16 further comprising one or more doped GaN layers coupled to the GaN epitaxial layer, wherein the one or more doped GaN layers are characterized by a doping density greater than $1\times10^{16}$ cm$^{-3}$.

18. The epitaxial semiconductor structure of claim 17 wherein each of the one or more doped GaN layers forms one of a set of epitaxial layers comprising:
a doped GaN layer characterized by a doping density greater than $1\times10^{16}$ cm$^{-3}$; and
an undoped GaN layer coupled to the doped GaN layer, wherein the undoped GaN layer is characterized by a dopant density less than $1\times10^{16}$ cm$^{-3}$.

19. The epitaxial semiconductor structure of claim 17 wherein the one or more doped GaN layers comprise an n-type GaN layer and a p-type GaN layer.

20. The epitaxial semiconductor structure of claim 19 further comprising an undoped GaN layer disposed between the n-type GaN layer and the p-type GaN layer, wherein the undoped GaN layer is characterized by a dopant density on the order of $1\times10^{16}$ cm$^{-3}$.

21. The epitaxial semiconductor structure of claim 16 wherein the silicon nitride partial layer comprises a partial monolayer of silicon nitride.

22. The epitaxial semiconductor structure of claim 16 further comprising an additional silicon nitride partial layer coupled to the GaN epitaxial layer.

* * * * *